United States Patent [19]

Lapeyrolerie et al.

[11] Patent Number: 4,727,314
[45] Date of Patent: Feb. 23, 1988

[54] TRANSIENT DETECTOR APPARATUS

[75] Inventors: Malcom L. Lapeyrolerie, Placentia; Hugh J. Murphy, Huntington Beach, both of Calif.

[73] Assignee: The United States of America as represented by the Secretary of the Air Force, Washington, D.C.

[21] Appl. No.: 763,578

[22] Filed: Aug. 8, 1985

Related U.S. Application Data

[63] Continuation-in-part of Ser. No. 452,602, Dec. 23, 1982, abandoned.

[51] Int. Cl.[4] ............................................. G01R 29/02
[52] U.S. Cl. .................................. 324/102; 307/234; 307/517; 324/103 P; 328/111; 328/114
[58] Field of Search .......................... 324/102, 103 P; 307/517, 234; 328/111, 114

[56] References Cited

U.S. PATENT DOCUMENTS

| | | | |
|---|---|---|---|
| 3,271,678 | 9/1966 | Daly et al. | 324/121 |
| 3,629,852 | 12/1971 | Thexton et al. | 340/172.5 |
| 3,795,861 | 3/1974 | Lazenby et al. | 324/102 |
| 3,986,116 | 10/1976 | Smith et al. | 324/102 |
| 4,068,172 | 1/1978 | Schuon | 324/102 |
| 4,339,712 | 7/1982 | Walters | 324/103 P X |
| 4,353,057 | 10/1982 | Bernet et al. | 324/102 X |
| 4,585,990 | 4/1986 | Murphy | 324/102 |

FOREIGN PATENT DOCUMENTS

| | | | |
|---|---|---|---|
| 2207315 | 8/1973 | Fed. Rep. of Germany | 324/103 P |
| 59-214714 | 12/1984 | Japan | 324/103 P |

OTHER PUBLICATIONS

IBM Technical Disclosure Bulletin, Swearingen, K., "Peak Detector and Storage System", vol. 8, No. 6, Nov. 1965, pp. 856–857.

*Primary Examiner*—Reinhard J. Eisenzopf
*Assistant Examiner*—Stephen M. Baker
*Attorney, Agent, or Firm*—William Stepanishen; Donald J. Singer

[57] ABSTRACT

A transient detector apparatus utilizing peak and slope detectors to determine the presence of transient signal in a logic signal. Individual slope measurements of the input signal are compared with a logic criteria to establish the occurrence of a transient. The peak voltage and pulse width of a transient are digitized in order to time tag or isolate a transient to a particular signal.

4 Claims, 32 Drawing Figures

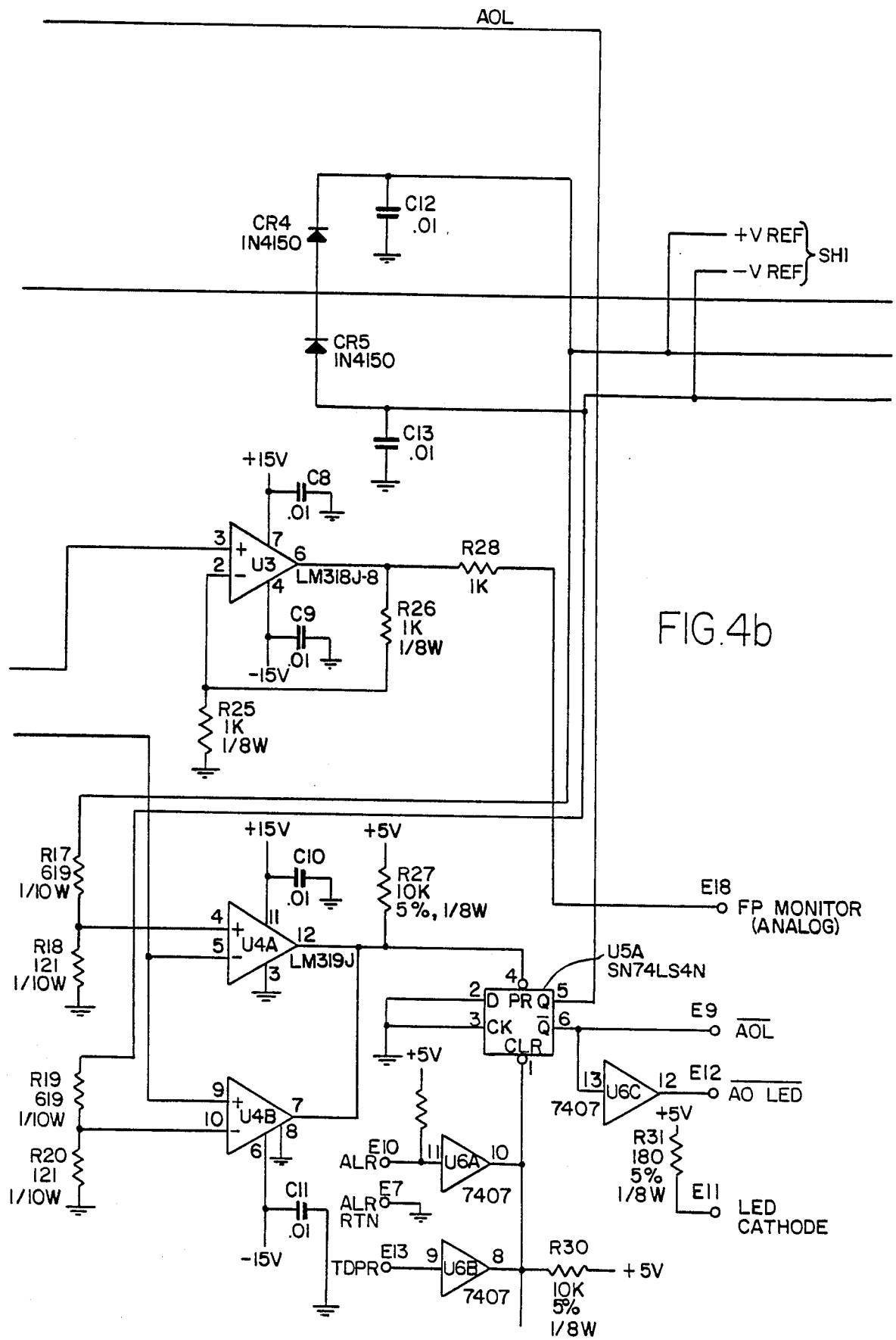

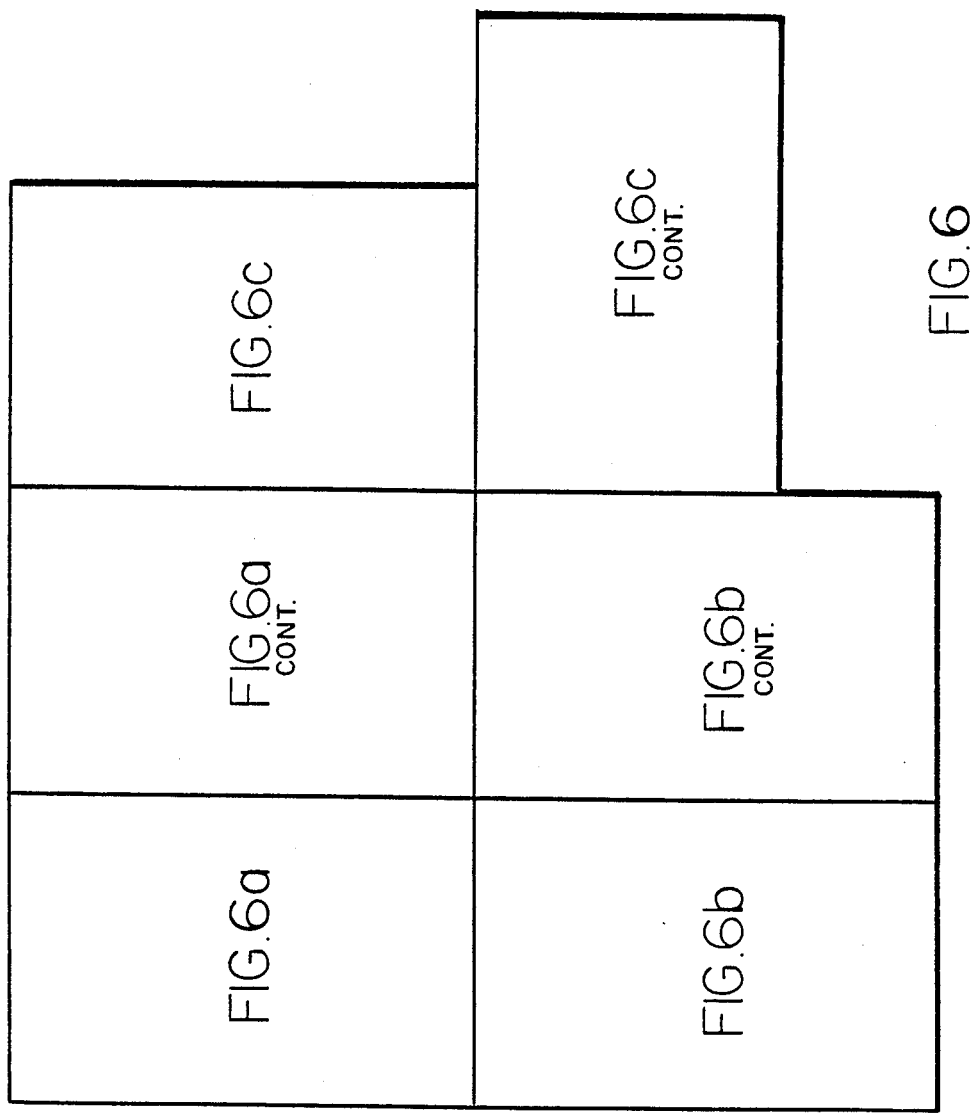

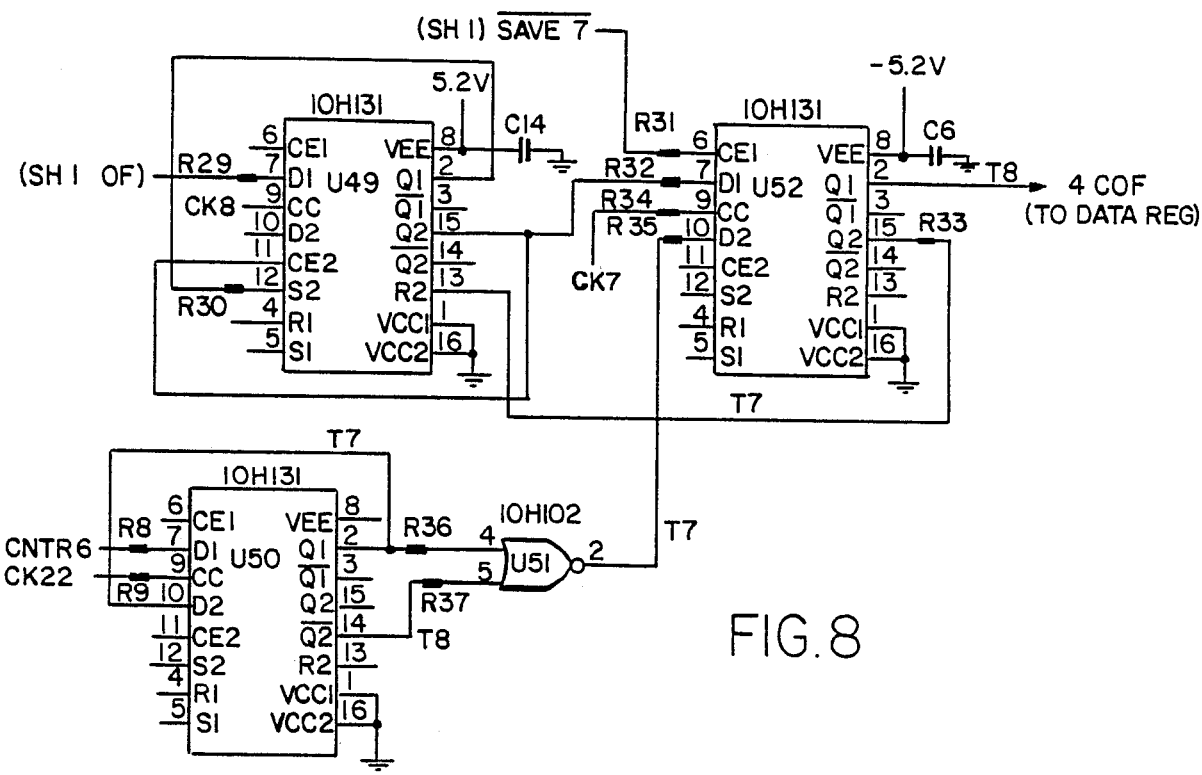
FIG. 8
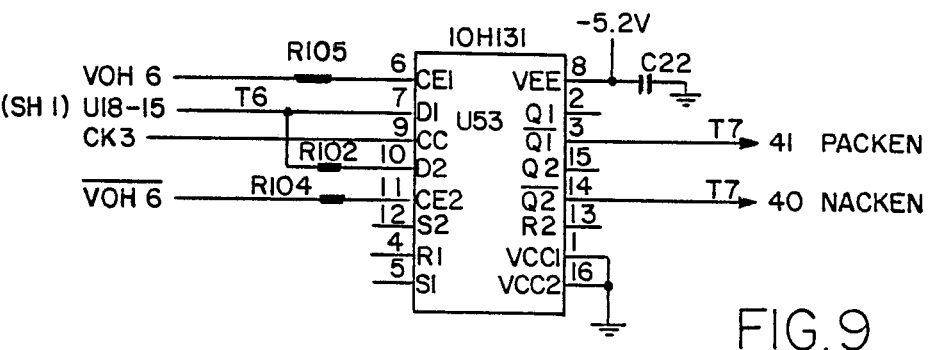
FIG. 9
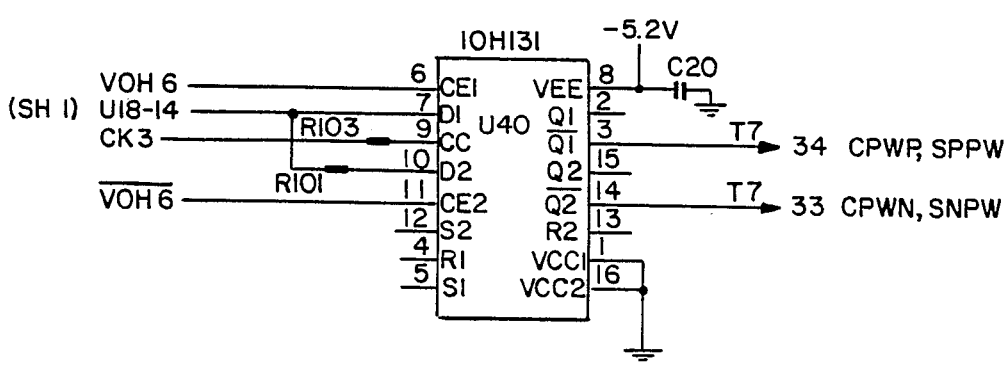

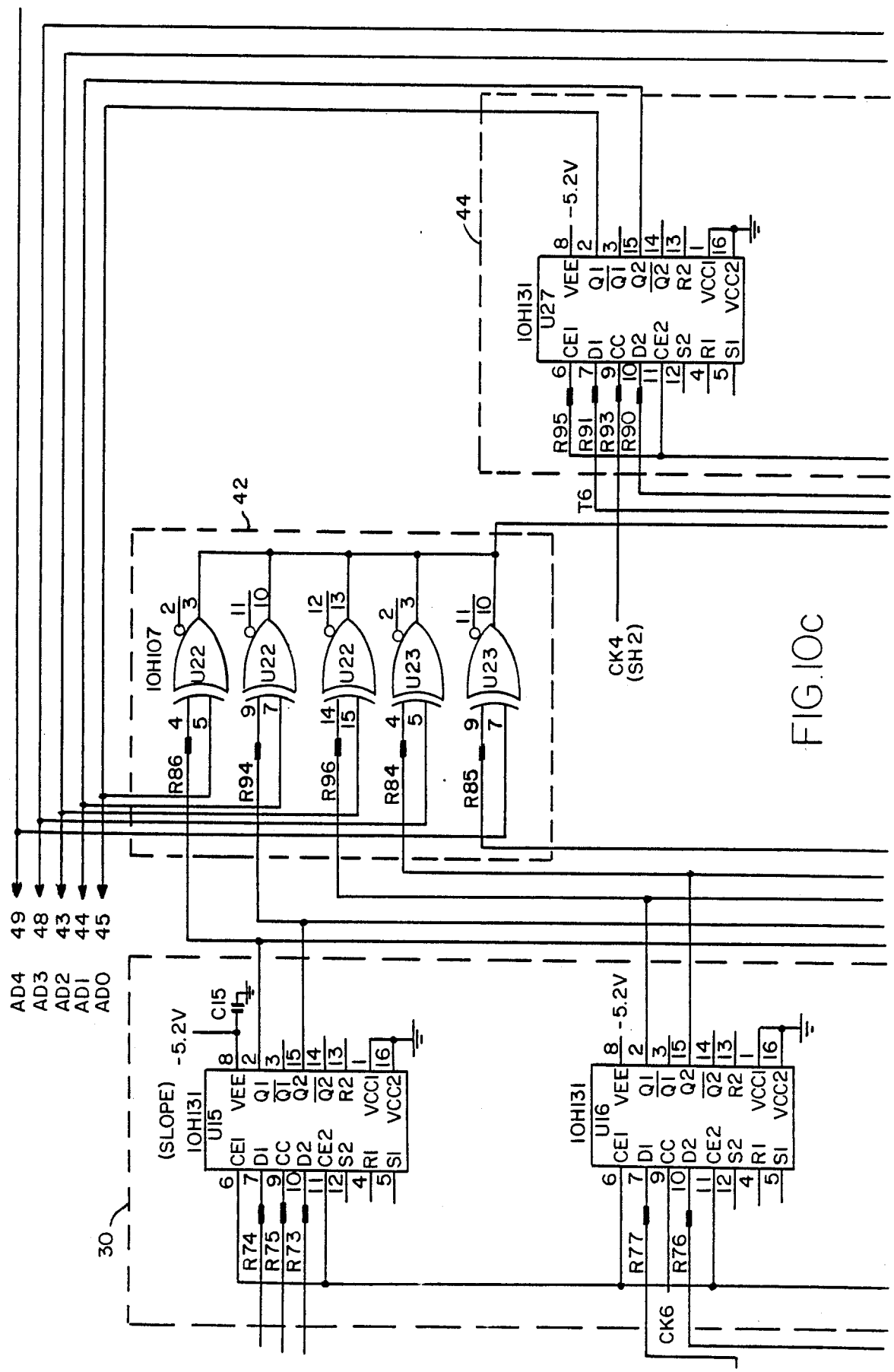

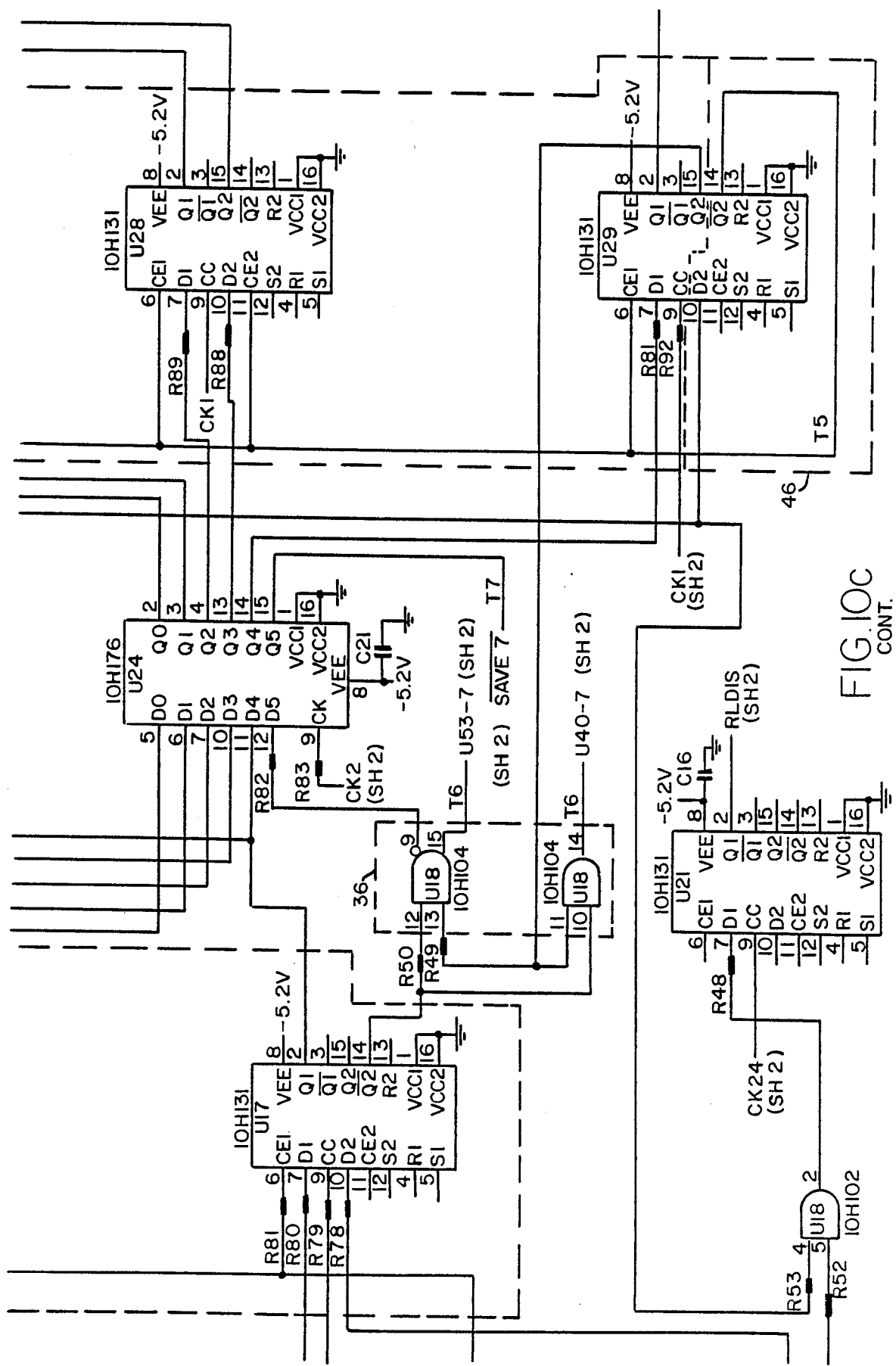

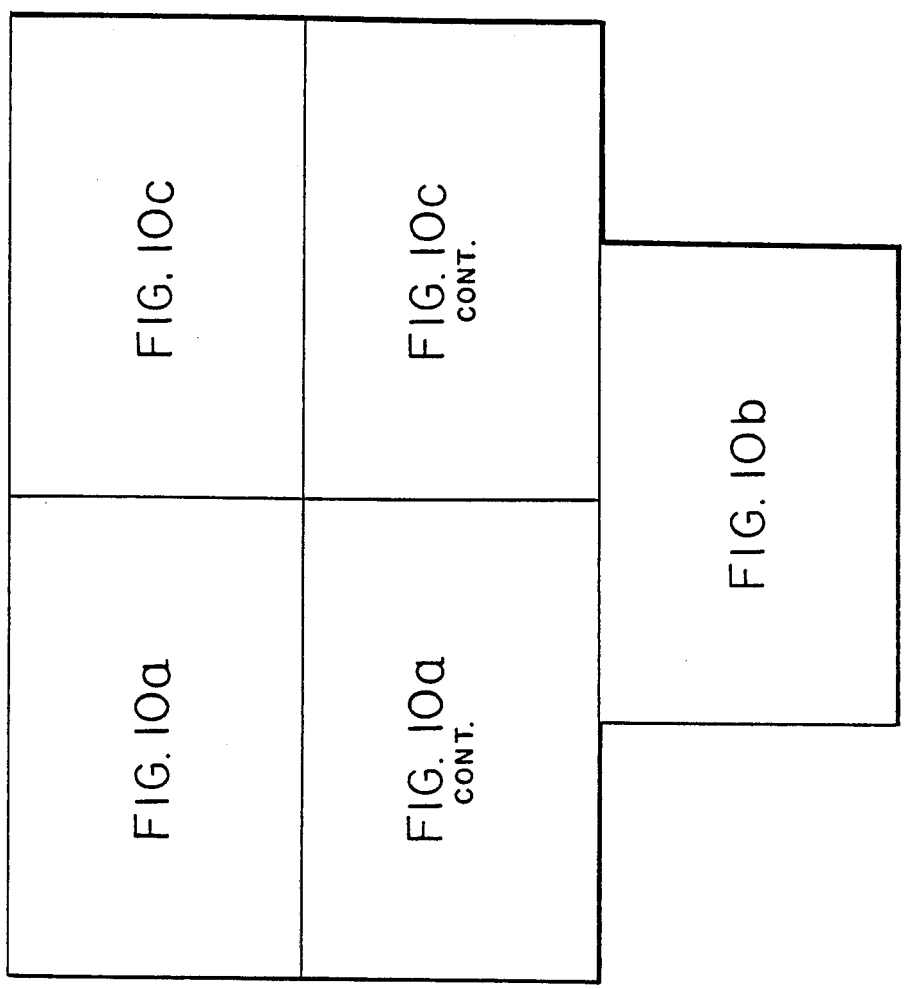

TRANSIENT DETECTOR APPARATUS

STATEMENT OF GOVERNMENT INTEREST

The invention described herein may be manufactured and used by or for the Government for governmental purposes without the payment of any royalty thereon.

The present application is a continuation in part of copending patent application Ser. No. 452,602 by the inventors Malcom L. Lapeyrolerie and Hugh J. Murphy, filed Dec. 23, 1982 now abandoned.

BACKGROUND OF THE INVENTION

The present invention relates broadly to a transient detector apparatus, and in particular to a transient detector apparatus for detecting transients within a dynamic logic signal waveform.

In the prior art, transient detecting systems have attempted by essentially brute force techniques, to record and measure transient phenomena in electrical systems. A transient by its very nature can occur at any time, can be of any magnitude, polarity duration, rise time and energy content. Thus, it may be seen that the problem of transient signals has been shown to be overwhelming. Further, transients, which may be harmless in one portion of a system, may be catastrophic in another portion of the system, and, therefore, it is frequently necessary to monitor several tests points throughout the system.

For high-speed transients, conventional recording devices such as oscillographs or plotters and have too much inertia and thereby have a very poor response to transient signals. As a result, such devices are inadequate because they are virtually insensitive to high speed transients. For low-speed transients, magnetic recorders and oscilloscopes (with a motion picture capability for a permanent record) are usually faster than necessary. These devices must be replayed to determine if a transient has occurred and, to determine the characteristics of the transient. This determination requires extensive review of the record that, for the most part, is substantially without information of interest.

To use the high-speed recording devices for high speed transients is an inefficient alternative since an extensive record must be reviewed. In the absence of a better method, however, these devices must be employed if high-speed transient phenomena are to be captured for subsequent analysis. Therefore, conventional methods are, at best, expensive, and, at worst, inadequate to collect and reproduce the necessary and desirable information.

SUMMARY OF THE INVENTION

The present invention utilizes a slope detector and a peak detector to measure transient signals that occur in the normal dynamic range of a logic voltage signal. The slope detector determines the slope of the input logic signal. The peak detector which determines and stores the peak value of the input signal, is controlled by a control unit. If the slope of an input logic signal crosses the 90 percent point of the full scale logic signal before a slope reversal occurs, the slope detector will indicate a normal logic transition and signal the control unit to discard the peak level which is stored in the peak detector. When a transient signal is detected, the control unit will send the peak value in the peak detector to a digitizer unit wherein the peak value will be converted to digital form and then outputted.

It is one object of the present invention, therefore, to provide an improved transient detector apparatus.

It is another object of the invention to provide an improved transient detector apparatus which accurately measures transient voltage waveforms having pulse widths in the range of five nanoseconds to one microsecond.

It is still another object of the invention to provide an improved transient detector apparatus to measure random transient signals which are superimposed on a dynamic logic voltage signal.

It is yet another object of the invention to provide an improved transient detector apparatus wherein the peak voltage and pulse width of the detected transient signal are converted to digital form.

These and other advantages, objects and features of the invention will become more apparent after considering the following description taken in conjuction with the illustrative embodiment in the accompanying drawings.

BRIEF DESCRIPTION OF THE DRAWINGS

FIGS. 4a–4c are a schematic diagram of the composite amplifier;

FIG. 4 is an illustration of the manner in which FIGS. 4a–4c are arranged to provide a complete schematic diagram;

FIG. 5 is an illustration of the manner in which FIGS. 5a–5d are arranged to provide a complete schematic diagram;

FIG. 6 is an illustration of the manner in which FIGS. 6a–6c are arranged to provide a complete schematic diagram;

FIG. 8 is a schematic diagram of the overflow indicator unit;

FIG. 9 is a schematic diagram of the positive/negative data select unit;

FIGS. 10a–10c are schematic diagram of the inverter select unit, the OR gates, the pulse width measurement/register units, the first data register unit, the AND gates, the timing register units, the comparator unit, the second data register unit and the timing control regulator unit;

FIG. 10 is an illustration of the manner in which FIGS. 10a–10c are arranged to provide a complete schematic diagram;

FIG. 11 is an illustration of the manner in which FIGS. 11a–11c are arranged to provide a complete schematic diagram;

FIGS. 12a–12d are a schematic diagram of the third data register unit 50, a portion of which is also shown in FIG. 11c; and, FIG. 12 is an illustration of the manner in which FIGS. 12a–12d are arranged to provide a complete schematic diagram.

DESCRIPTION OF THE PREFERRED EMBODIMENT

Figure 1:
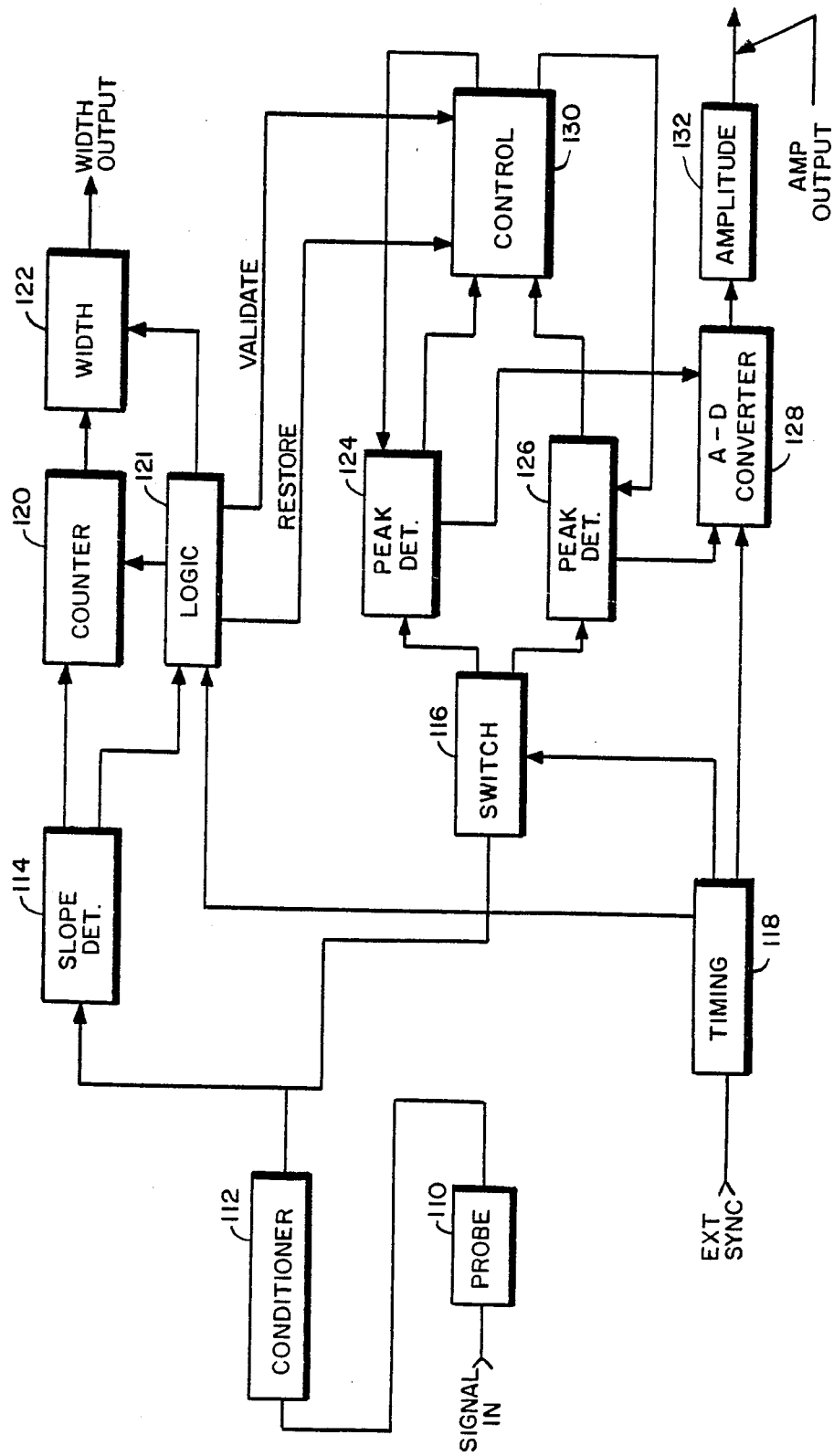
FIG. 1 is a block diagram of the transient detector apparatus according to the present invention.

Referring now to FIG. 1, there is shown a block diagram of the transient detector apparatus wherein the input signal is applied to the input monitor probe 110. The logic input signal which may comprise a dynamic logic signal is applied to the signal conditioner unit 112. In the signal conditioner unit 112, the logic input signal is examined to determine the correct logic level of the digital bits in the logic input signal. Thus, the signal conditioner unit 112 generates corrected logic one and logic zero levels for signal levels which meet the respective conditions and criteria for a logic one or zero. On the basis of that determination, the remaining (levels that did not qualify as logic signals) signal levels are considered unwanted transient signals that are present in the logic input signal. The output signal from the signal conditioner unit 112 is simultaneously applied to the slope detector unit 114 and the switch unit 116. The slope detector unit 114 is activated by the input signal and generates a digital pulse signal which is proportional to the slope of the input signal. The digital pulse signal from the slope detector unit 114 is applied to both the counter unit 120 and the logic unit 121. The logic unit 121 determines whether the digital pulse signal represents a logic signal or a transient signal. When the logic unit 121 determines that the digital pulse signal is a transient signal, it generates a validate signal which is sent to the control unit 130. When the digital pulse signal from the slope detector unit 114 represents a logic signal, the logic unit 121 outputs a restore signal to the control unit 130.

The counter unit 120 applies the digital pulse signal to the width unit 122 when the logic unit 121 provides a transient detected signal to the counter unit 120. The width unit 122 measures and determines the pulse width of the transient signal which is represented by the digital pulse signal from the counter unit 120. The width unit 122 outputs a digital signal which represents the pulse width of the transient signal upon receipt of a control signal from the logic unit 121.

The switch unit 116 which receives the input signal from the signal conditioner unit 112, applies the input signal to one of the peak detector units 124 or 126. The peak detector units 124, 126 provide an enable signal to the control unit 130 to indicate which peak detector unit has received the input signal therein. When the control unit 130 receives a validate signal from the logic unit 121, it signals the peak detector unit to send the peak signal level therein to the A/D converter unit 128. The A/D converter unit converts the peak signal level to a digital amplitude signal. The output from the A/D converter unit 128 is applied to the amplitude unit 132. The amplitude unit 132 provides an amplitude output signal which represents the amplitude of the detected transient signal that was present in the input signal. A timing unit 118 which receives an external synch signal provides timing signals to the logic unit 121, the switch unit 116, and the A/D converter unit 128.

The transient detector apparatus operates in the following manner. The signal of interest is monitored with a high impedance, wide bandwidth probe 110. The output from the input monitor probe 110 is fed to the signal conditioner unit 112. The signal conditioner unit 112 drives a slope detector unit 114 and either peak detector unit 124 or 126 by means of switch unit 116. The peak detector units 124, 126 contain a charge transfer device which outputs a signal whenever the input signal is larger than any previously stored signal. The peak detector unit has a control capability that allows any peak value to be discarded or saved at the discretion of the control circuit 130. The slope detector unit provides a slope signal to the logic unit. The logic unit utilizes the slope signal to determine whether a signal is a valid logic transition or a transient signal. It monitors the signal under test in terms of signal amplitude and slope. If the input voltage crosses ninety percent of the full scale value before a slope reversal occurs, the logic unit outputs a restore signal indicating that a normal logic transition occurred. This restore signal will signal the control unit 130 to discard the logic level which is stored in the peak detector. The restore signal permits the control unit 130 to reset the charge transfer device (located within the peak detector) and thereby prepare it for the next input signal transition. If the logic unit 121 encounters a slope reversal prior to reaching the ninety percent point of the full scale signal value, it will output a validate signal to the control unit 130 which will signal the peak detector to store this peak value as a transient. Once a transient value is stored and validated, only transient signals of a larger value (within a given period of time) can cause a peak detector output.

The charge transfer device, which is located within the peak detector unit, has a time limited storage accuracy. Therefore, it is necessary to alternate between two of these devices. This is accomplished by means of an analog switch 116. Every millisecond the stored value of one of the devices is digitalized and stored while the second device is used to monitor the signal under test. This procedure is alternated every millisecond and the largest peak amplitude and the associated pulse width is maintained in digital storage (width unit 122 and amplitude unit 126) until interrogated by the user. When this occurs the storage registers 122, 126 will output two eight bit words which are a measurement of transient amplitude and pulse width. The transient peak amplitude is accurate to five percent and the pulse width is accurate to 4 nanoseconds.

Figure 2:
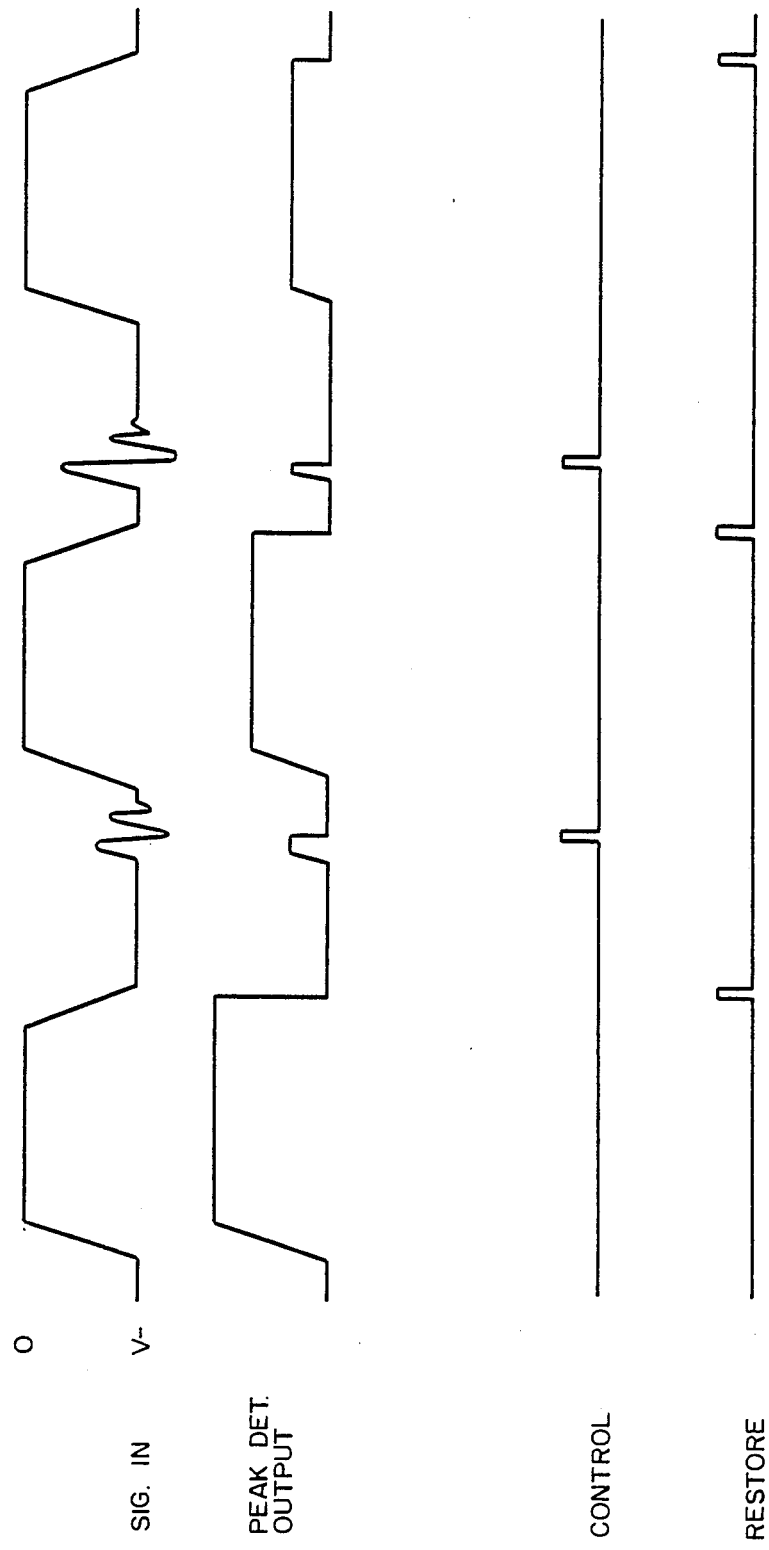
FIG. 2 is a graphical representation of the timing relationship of key signals in the circuit shown in FIG. 1.

There is shown in FIG. 2 is a timing diagram which depicts the key circuit functions. The first signal (SIG IN) is a typical logic signal that would be monitored by the transient detector. The second signal (PEAK DETECTOR OUTPUT) is a result of what occurs as a function of the SIG IN. The peak detector output is proportional to the difference in the last transient stored and the peak of the new input signal. The third signal (CONTROL) occurs whenever a transient has been validated. The fourth signal (RESTORE) occurs whenever a logic signal returns to a predetermined level.

Figure 3:
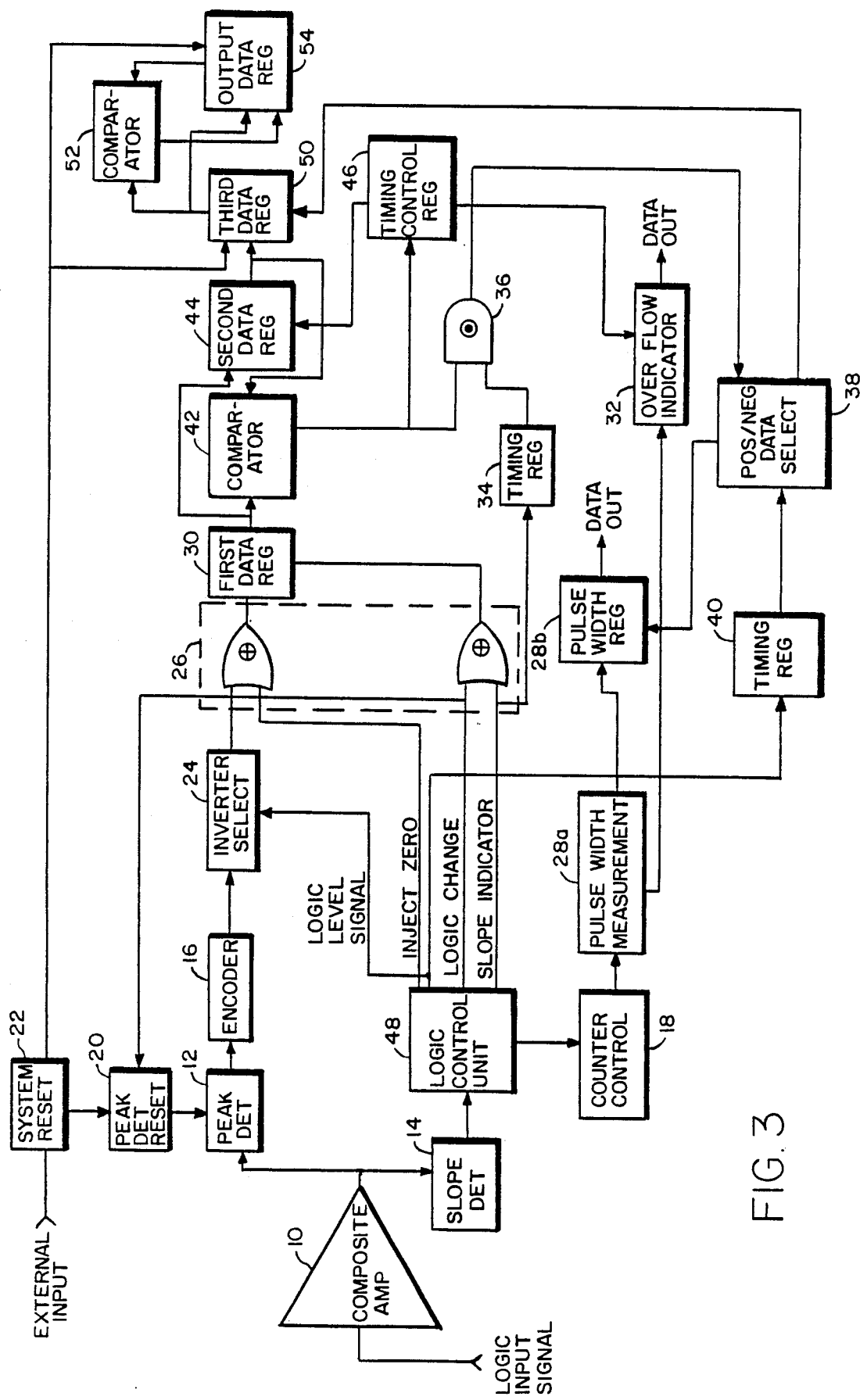
FIG. 3 is a block diagram showing the transient detector apparatus in greater detail.
Figure 4A:
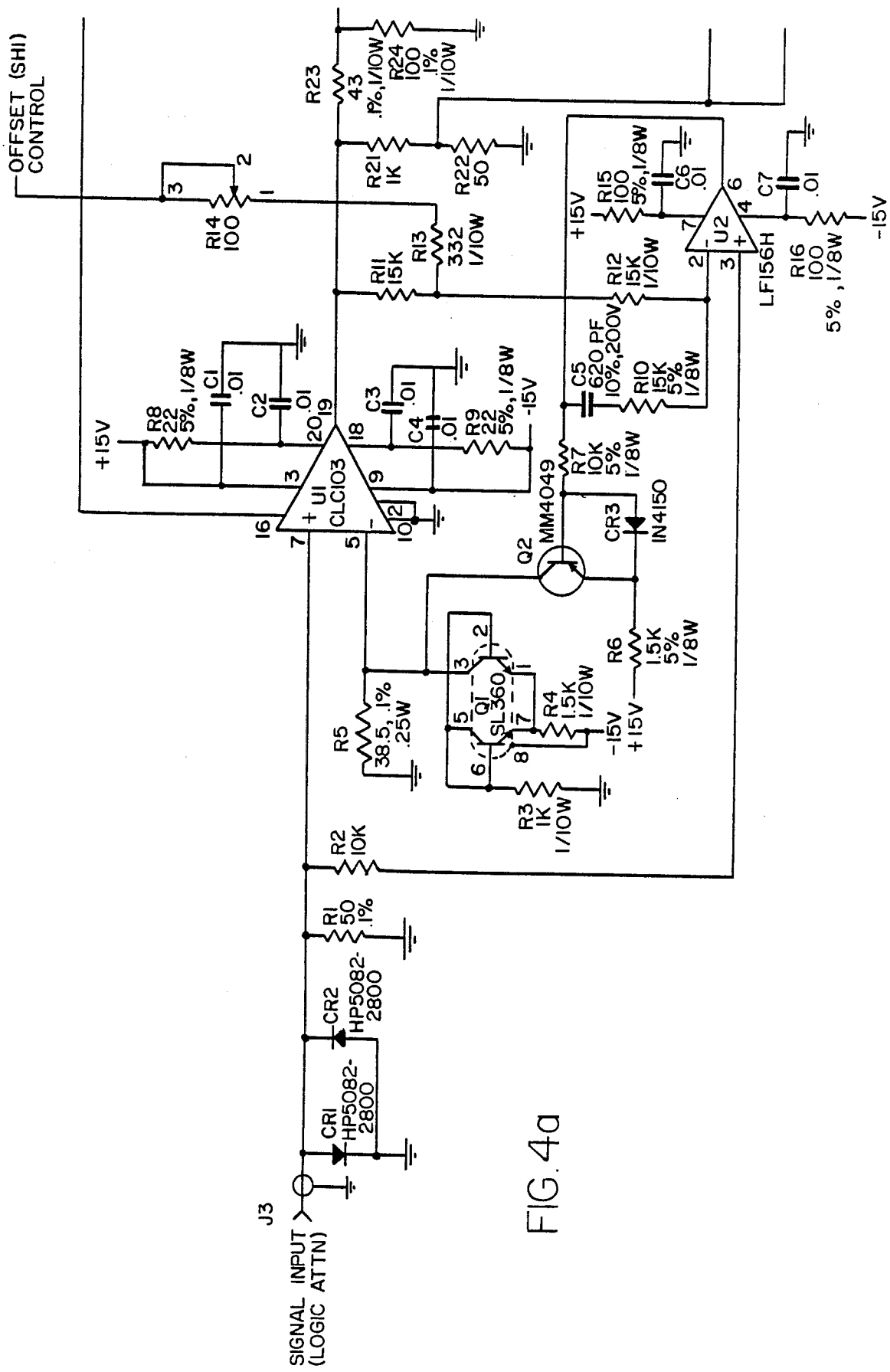
Figure 4C:
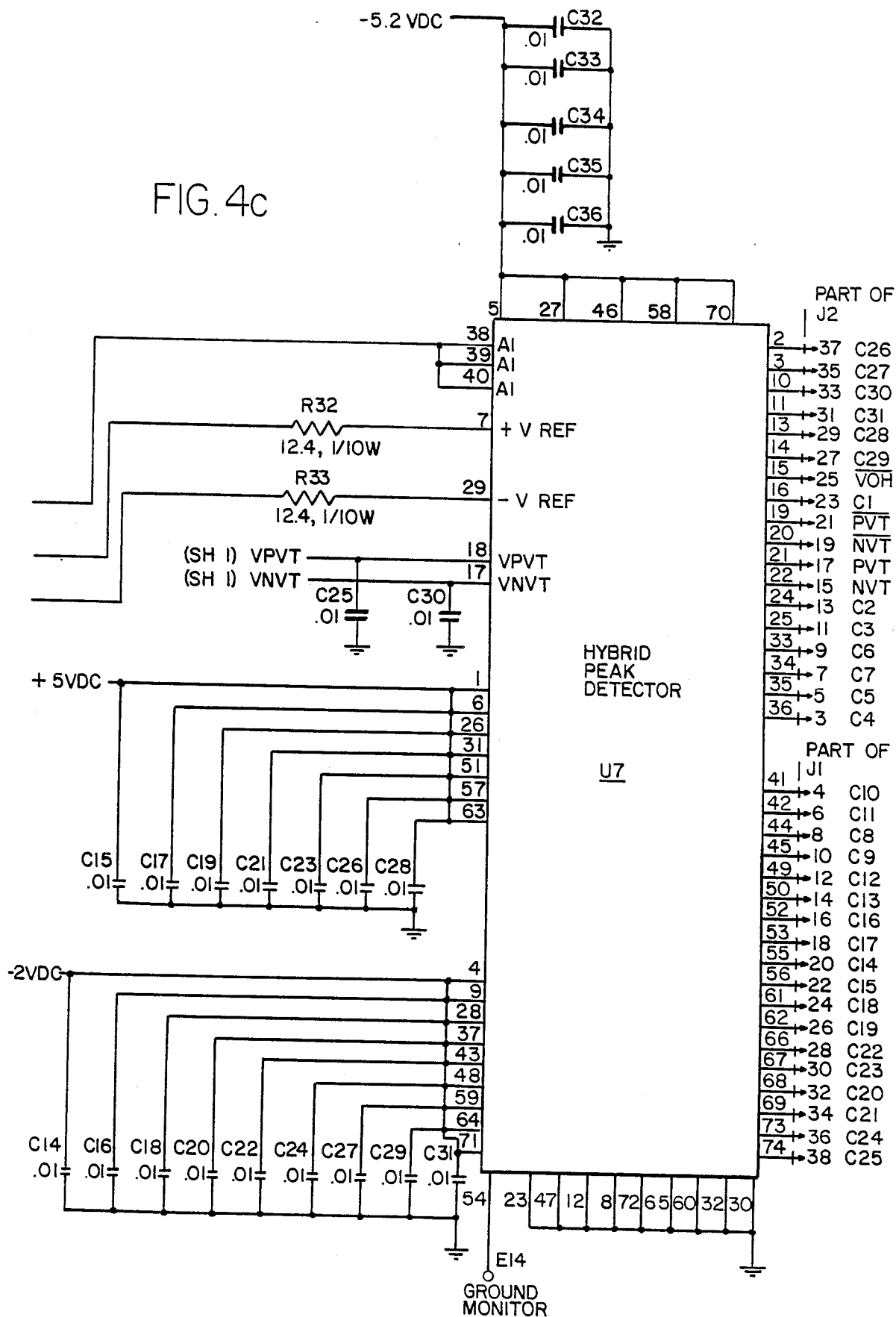
Figure 4:
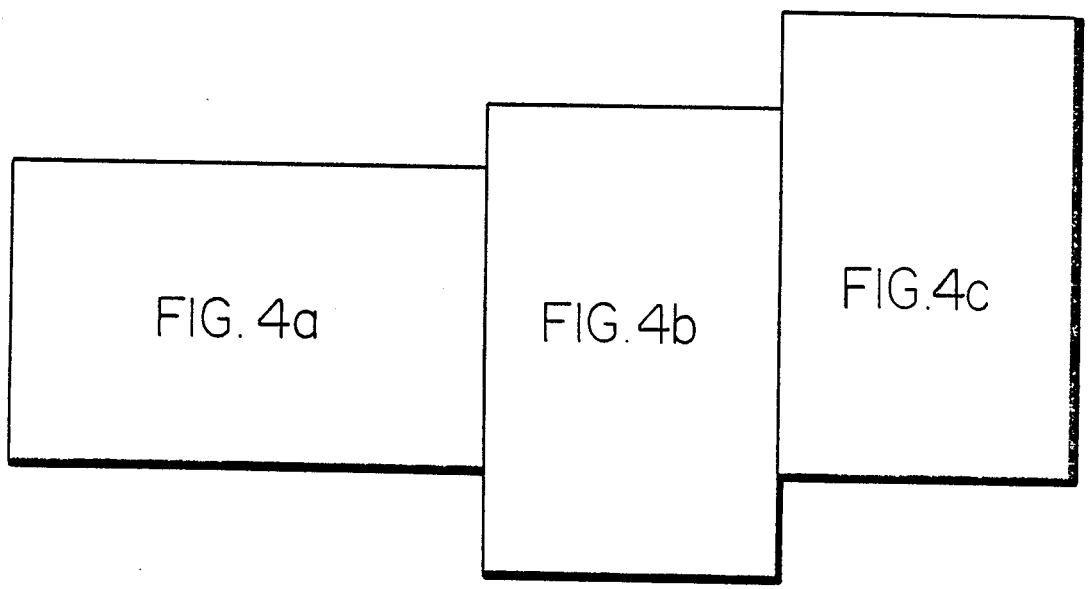
Figure 5A:
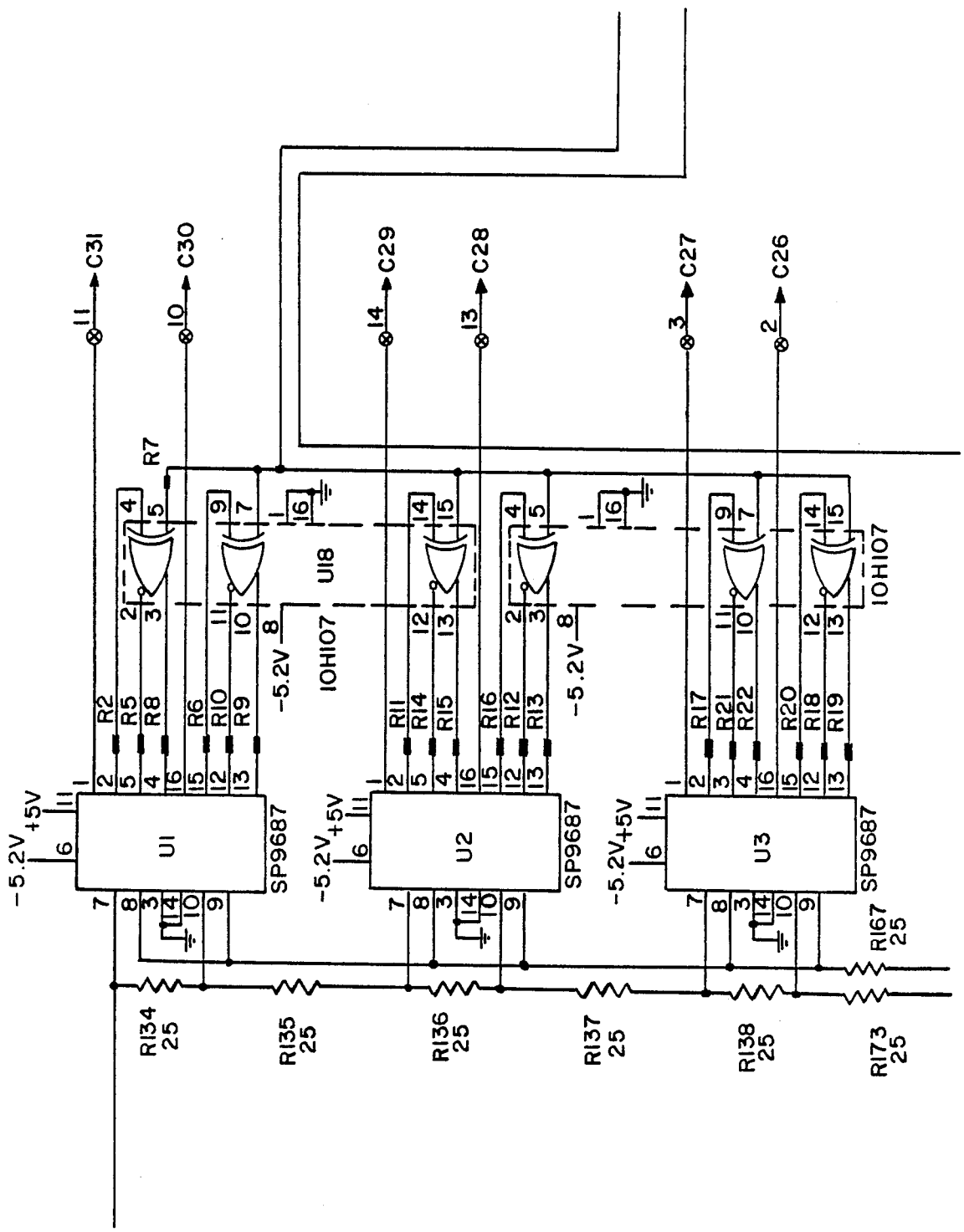
FIGS. 5a–5d are a schematic diagram of the peak detector unit and a portion of the slope detector unit.
Figure 5A:
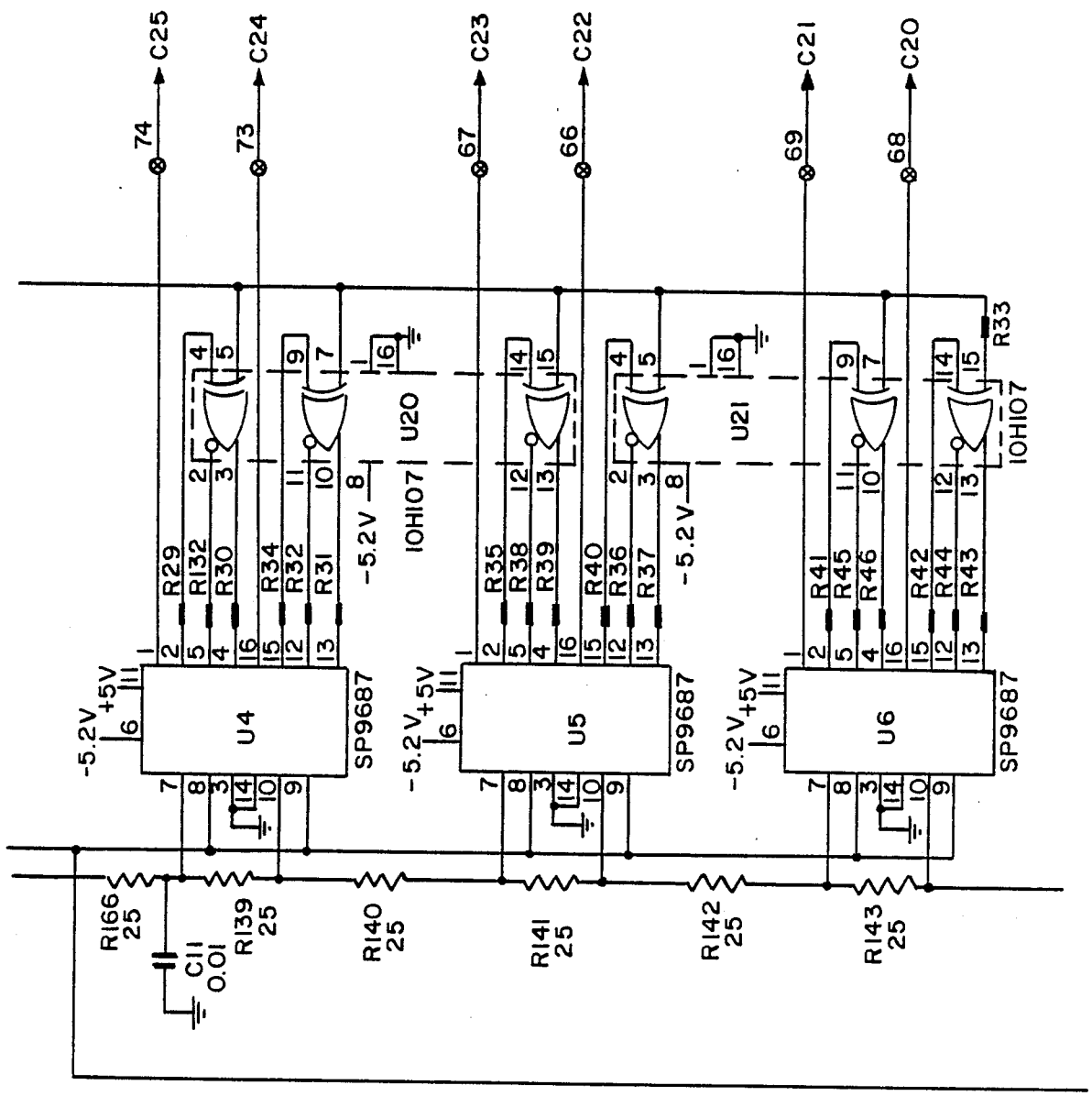
Figure 5B:
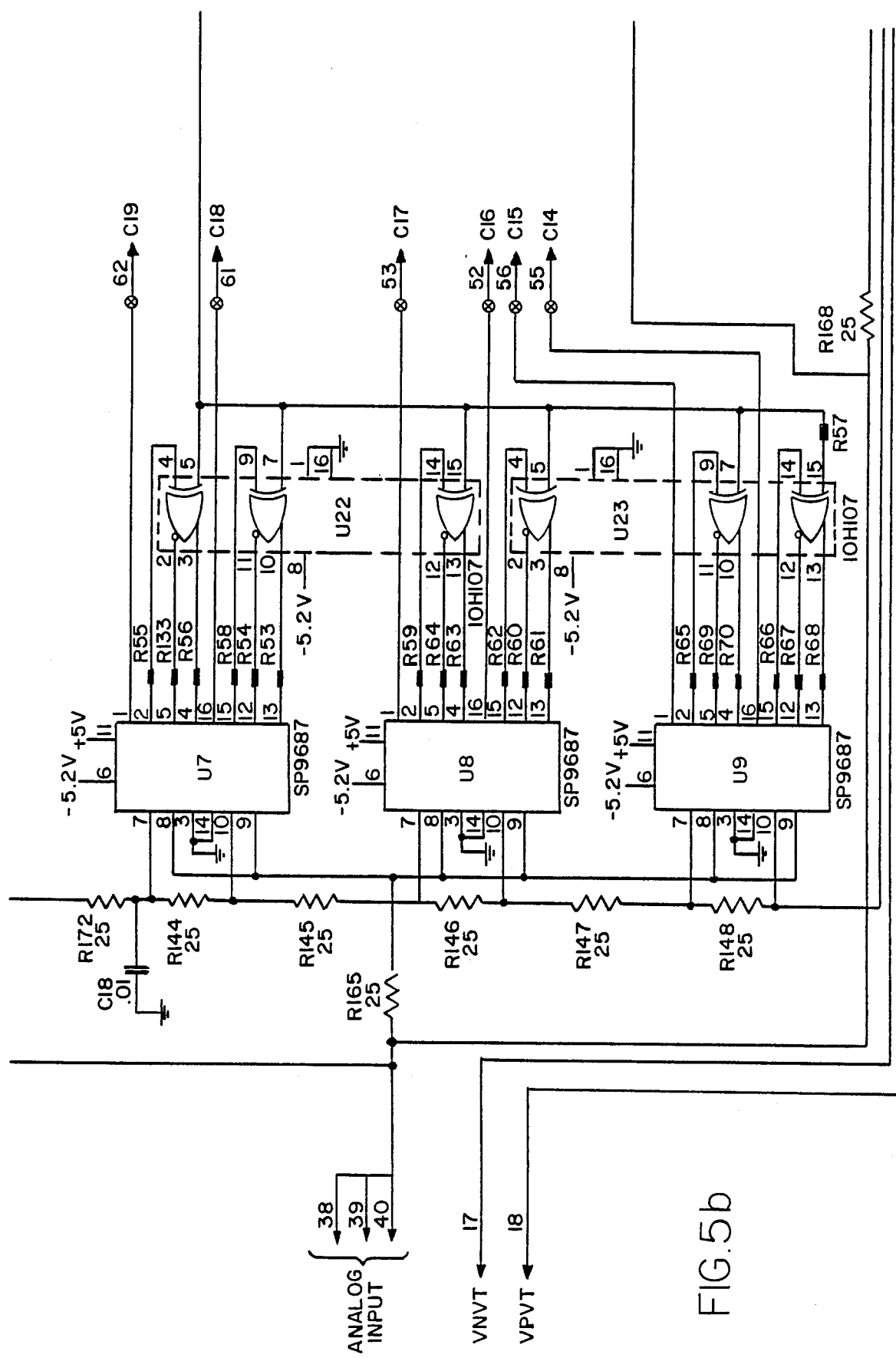
Figure 5C:
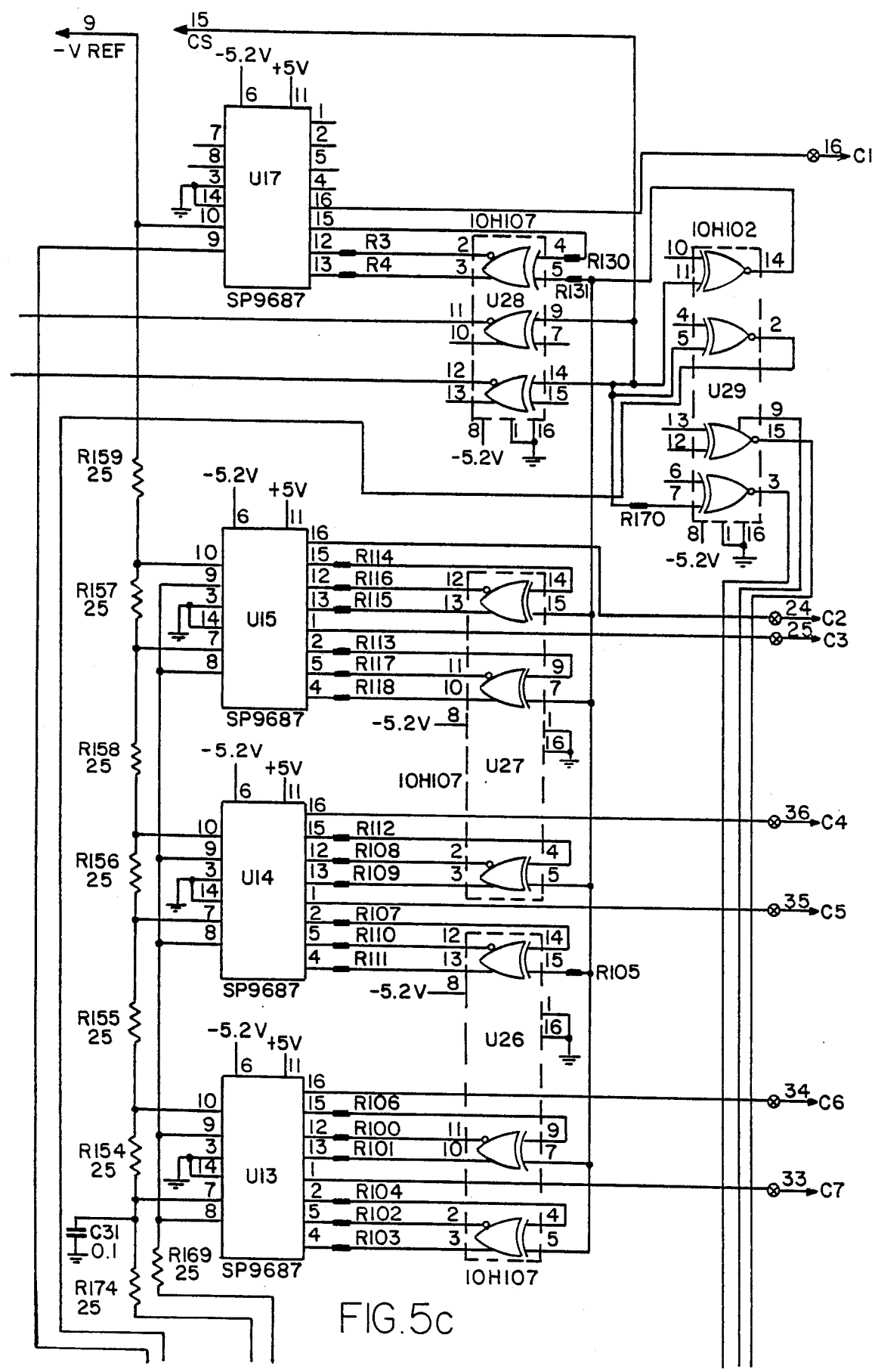
Figure 5D:
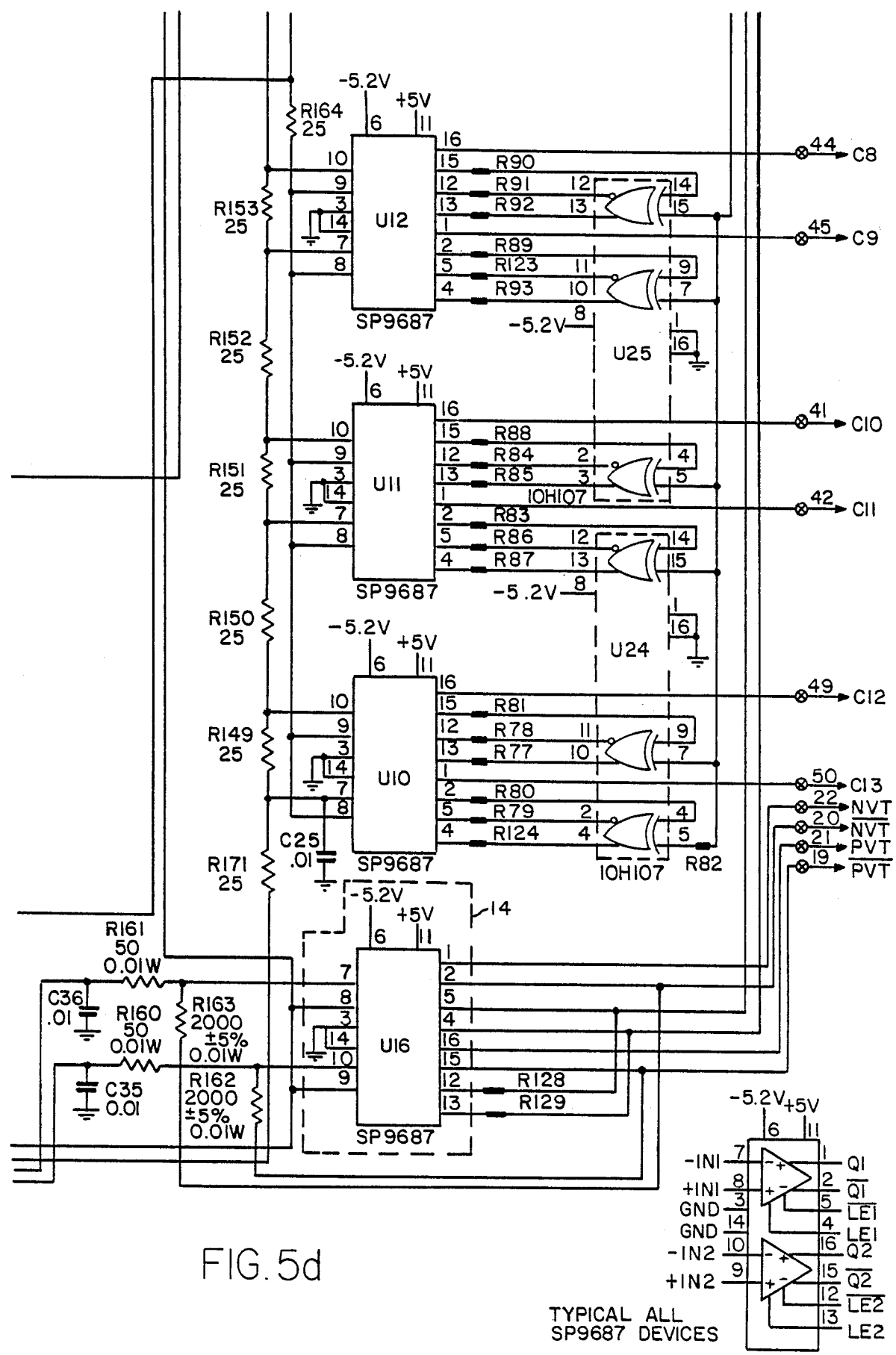
Figure 5:
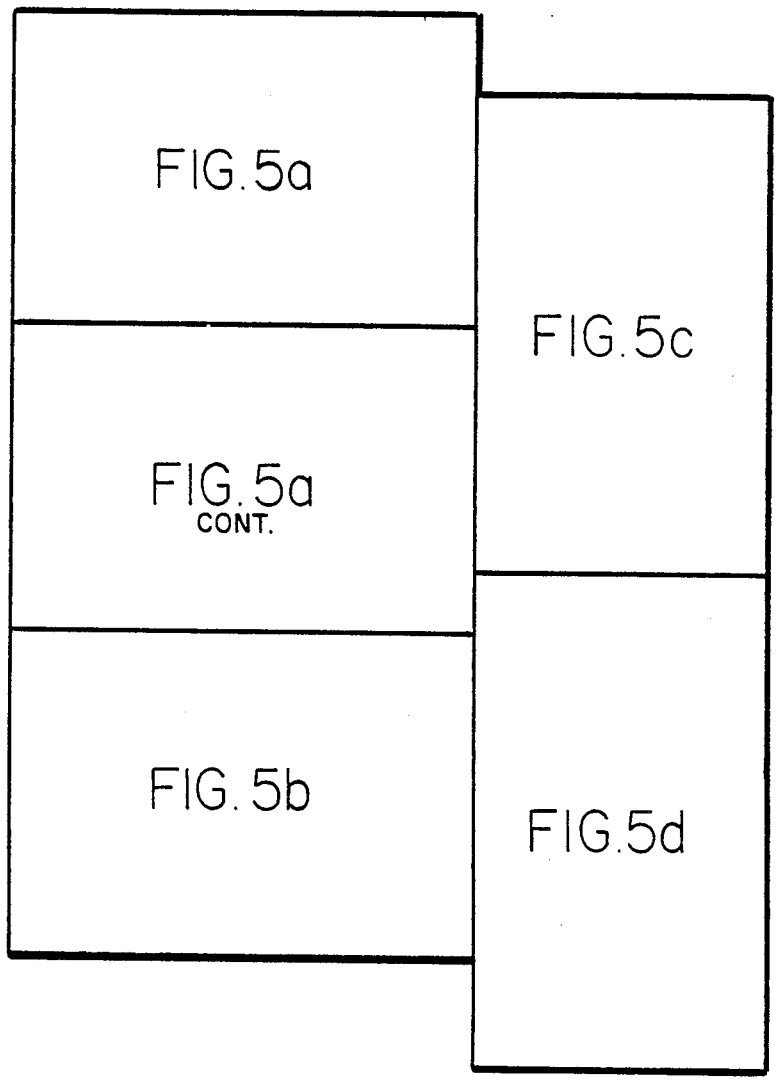
Figure 6A:
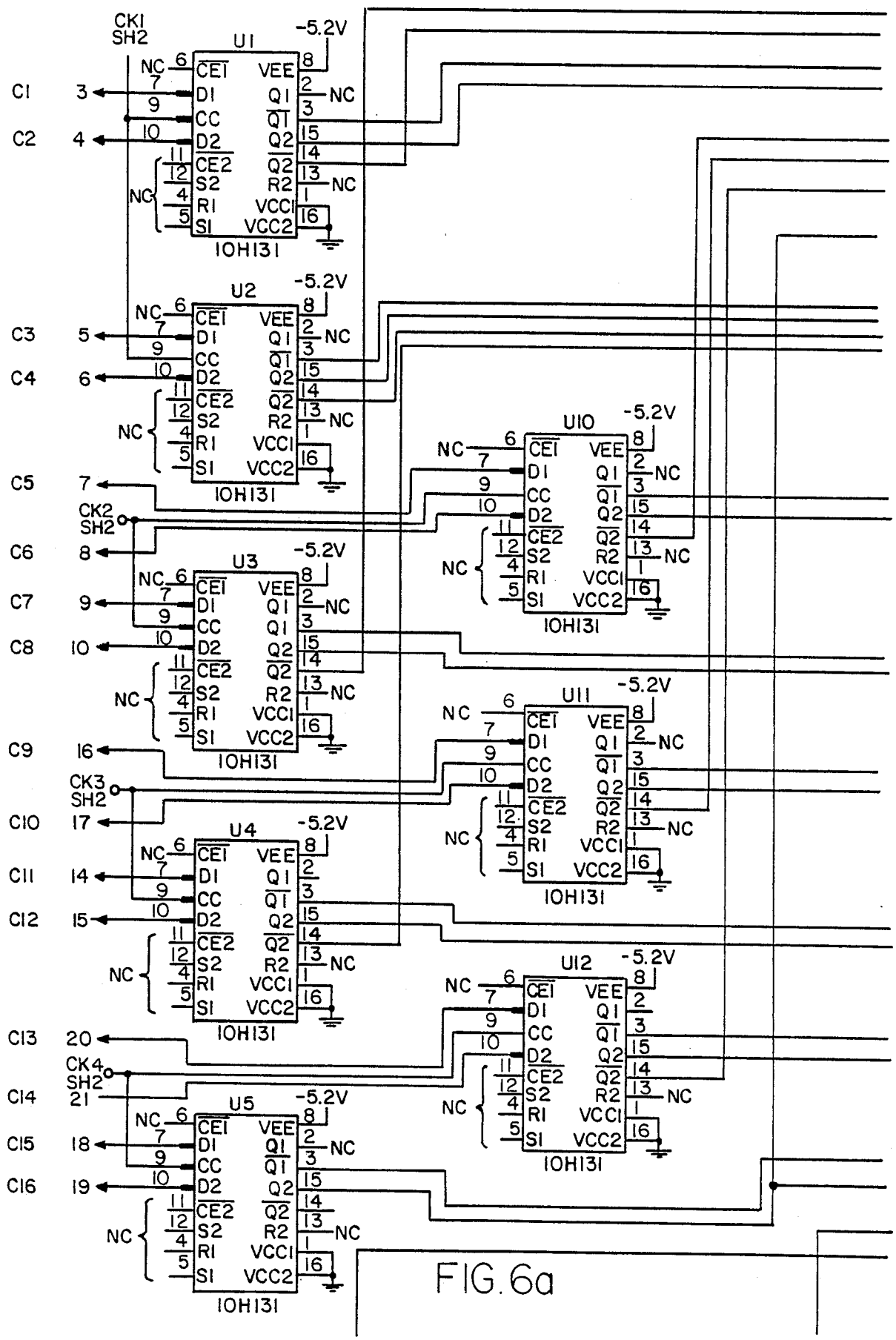
FIGS. 6a–6c are schematic diagrams of the encoder unit, a portion of the slope detector and the logic control unit.
Figure 6A:
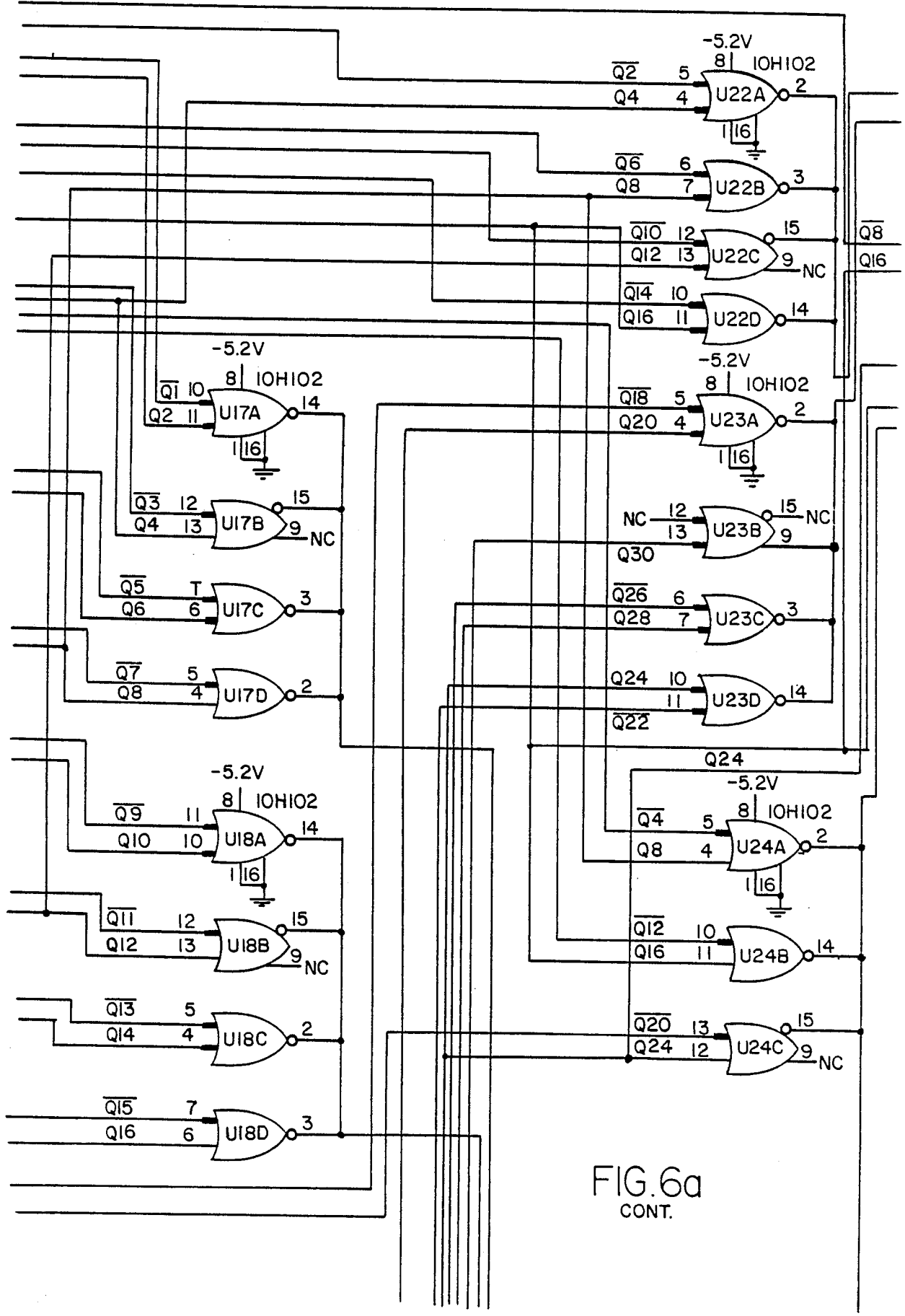
Figure 6B:
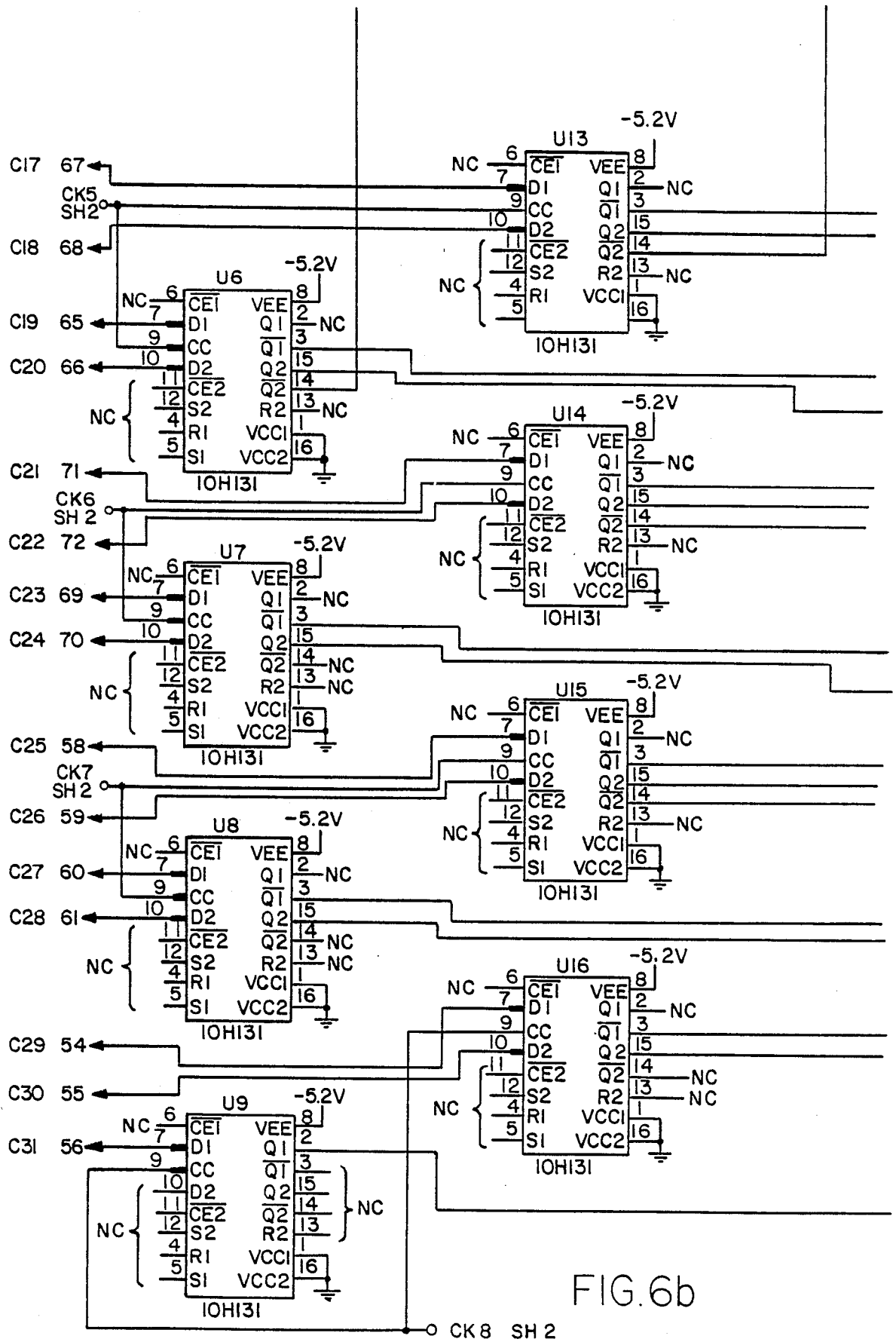
Figure 6B:
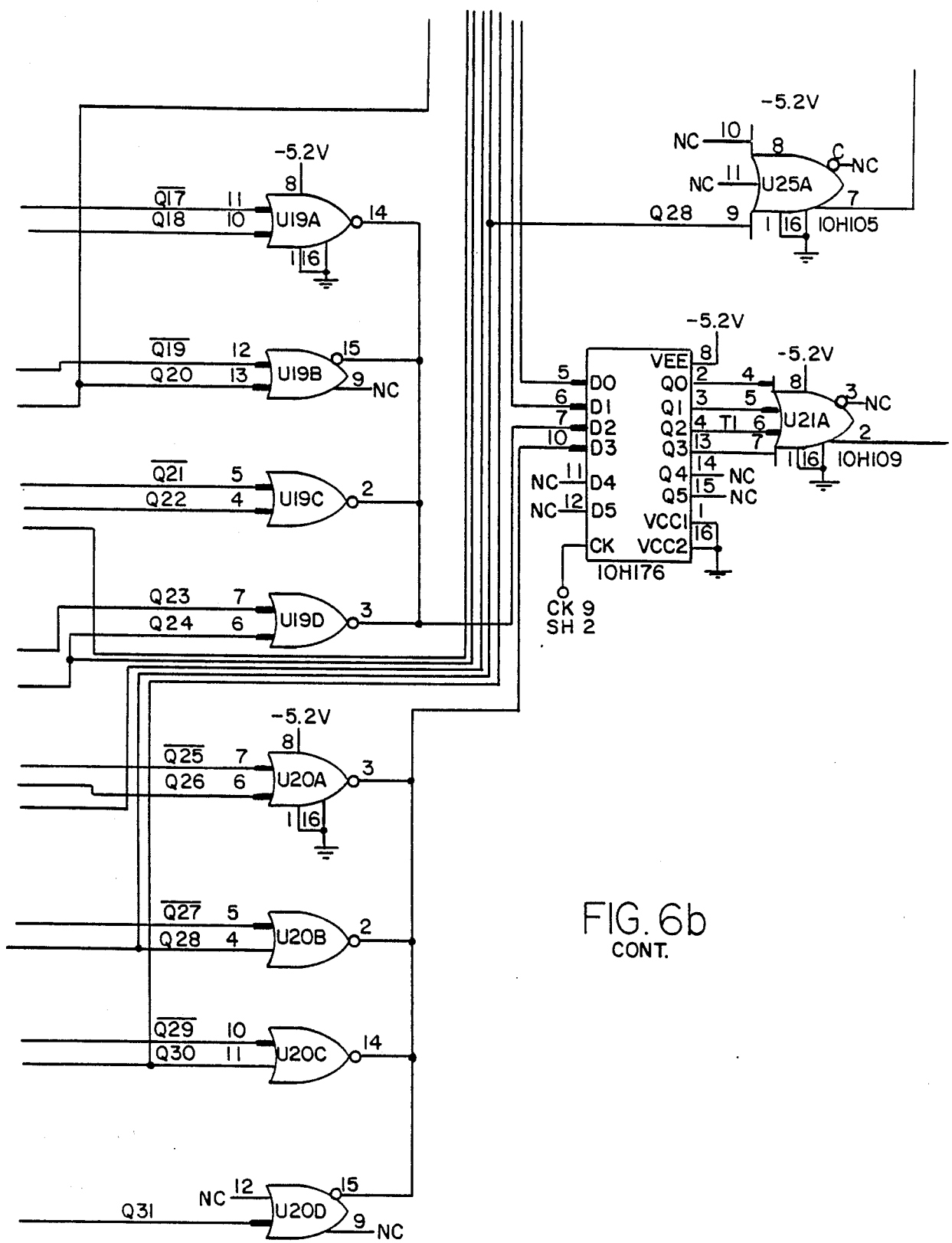
Figure 6C:
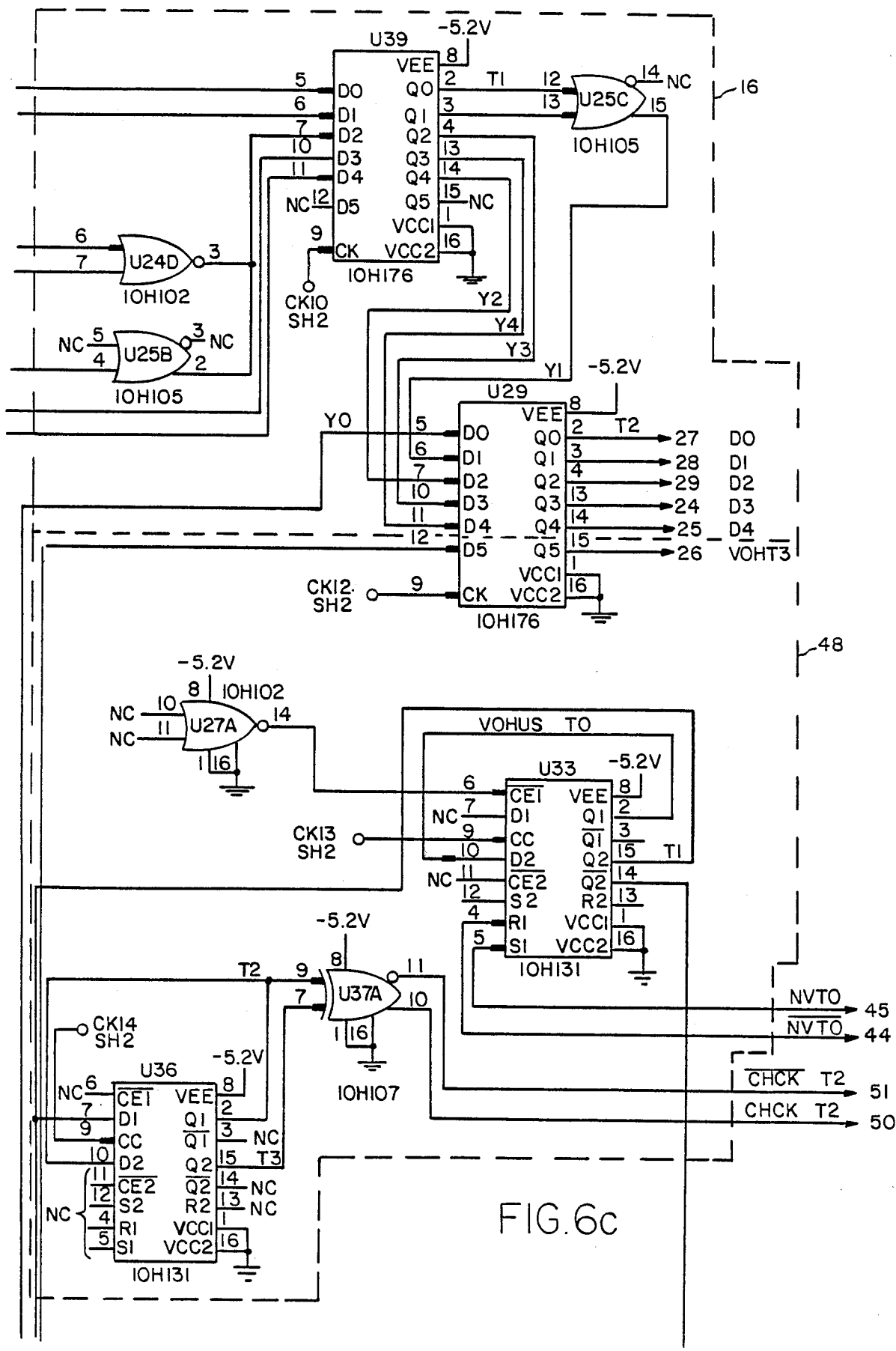
Figure 6C:
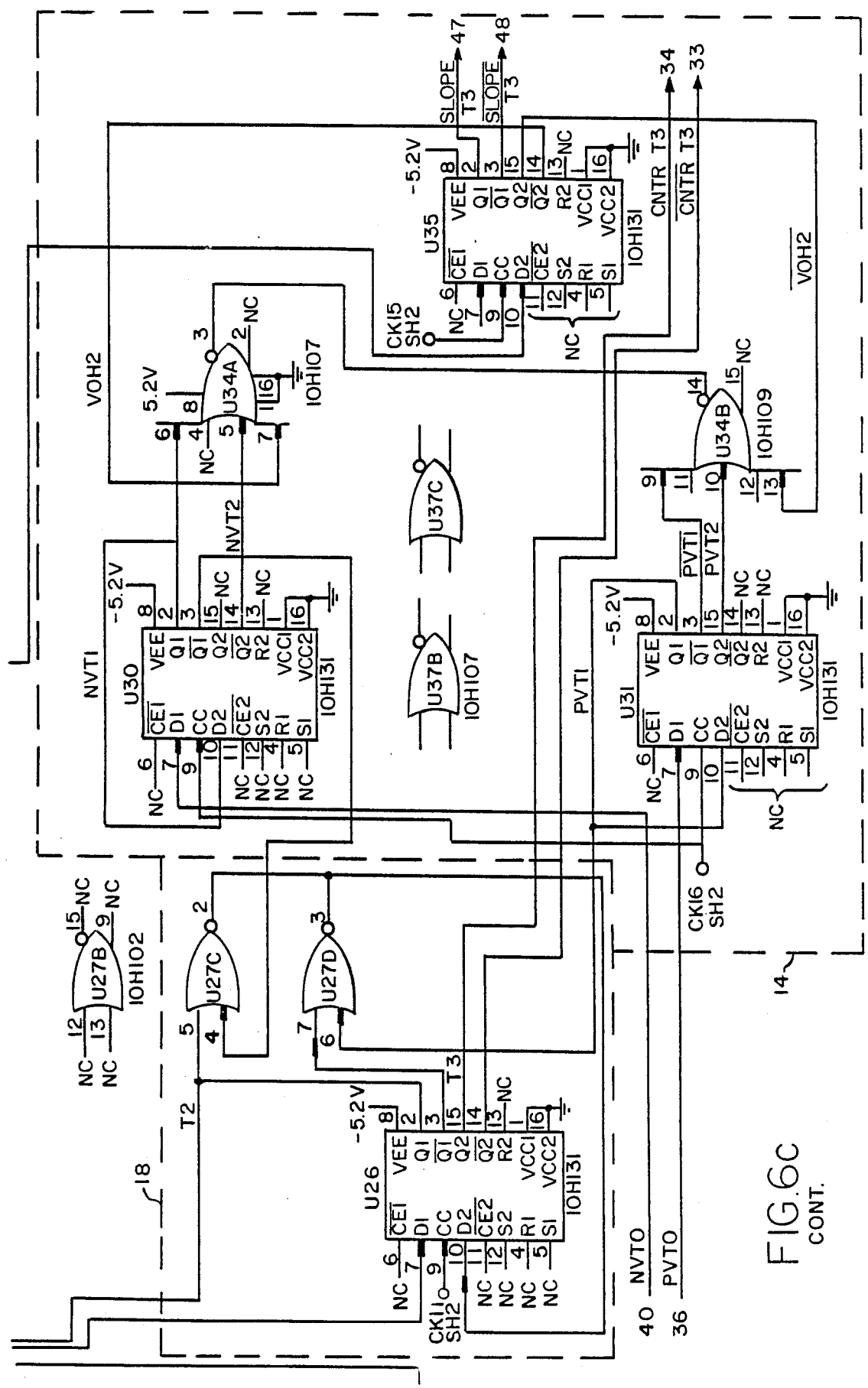
Figure 7:
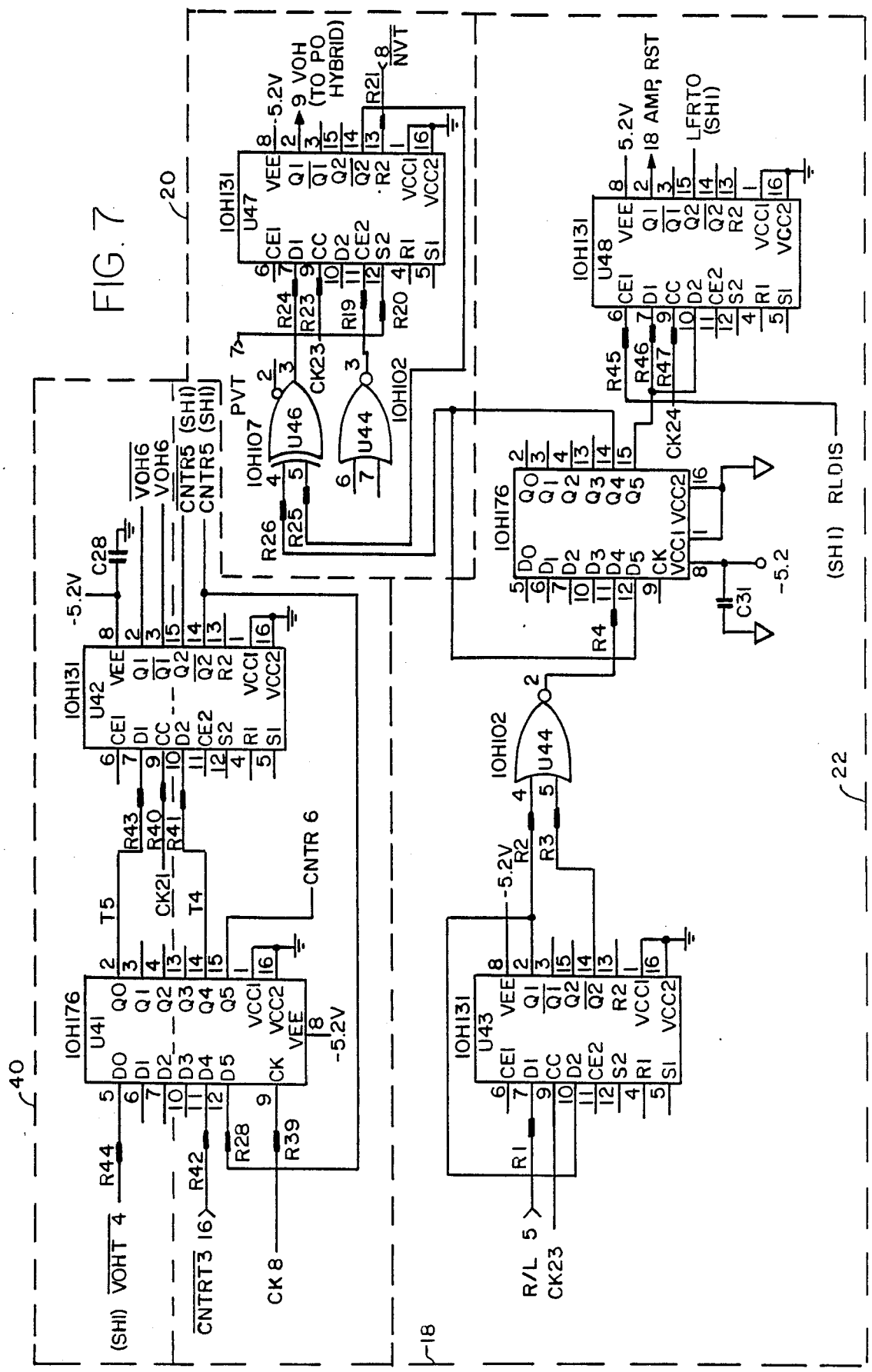
FIG. 7 is a schematic diagram of the counter control unit, the peak detector reset unit, the system reset unit, and the timing register unit.
Figure 10A:
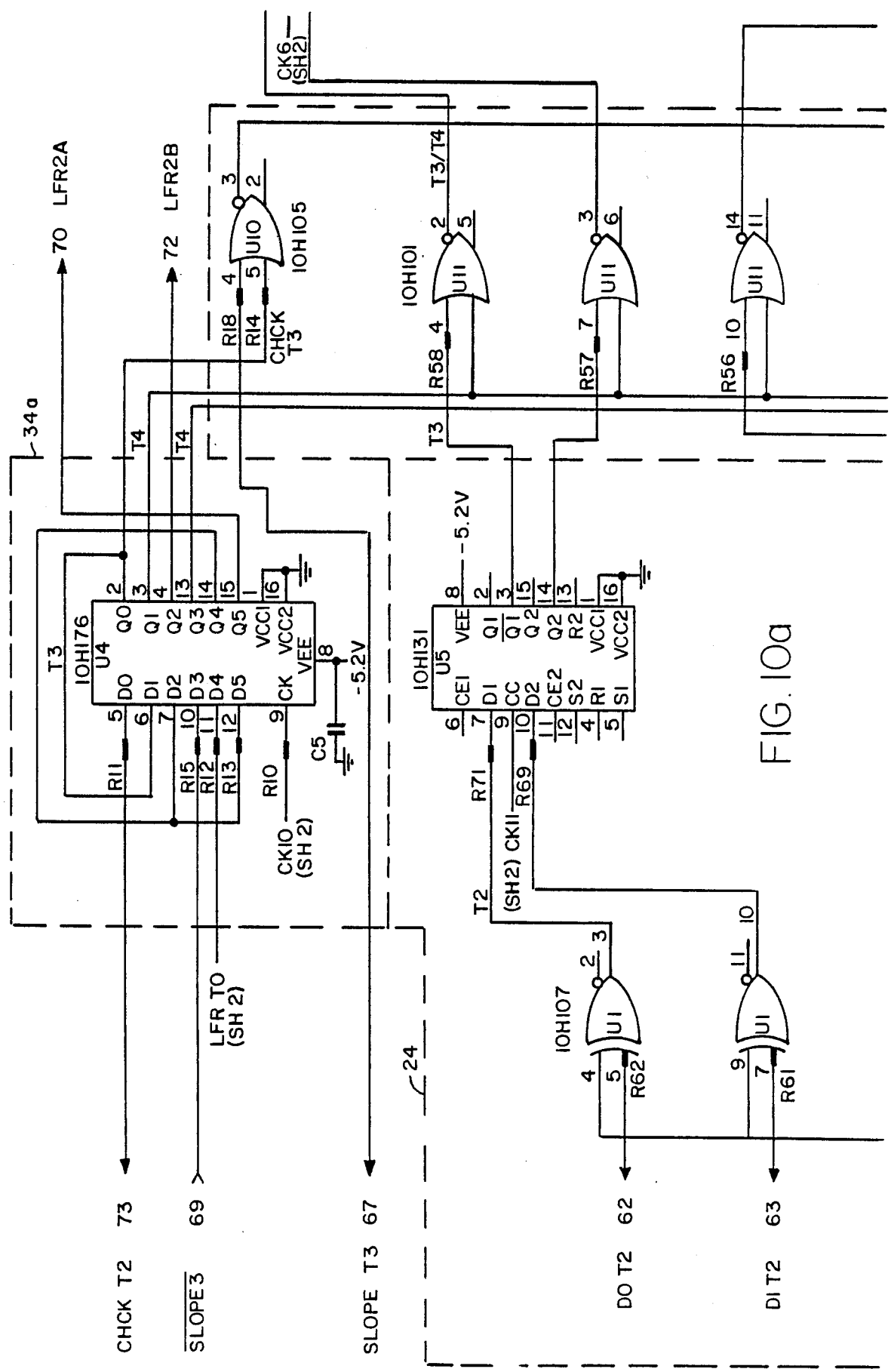
Figure 10A:
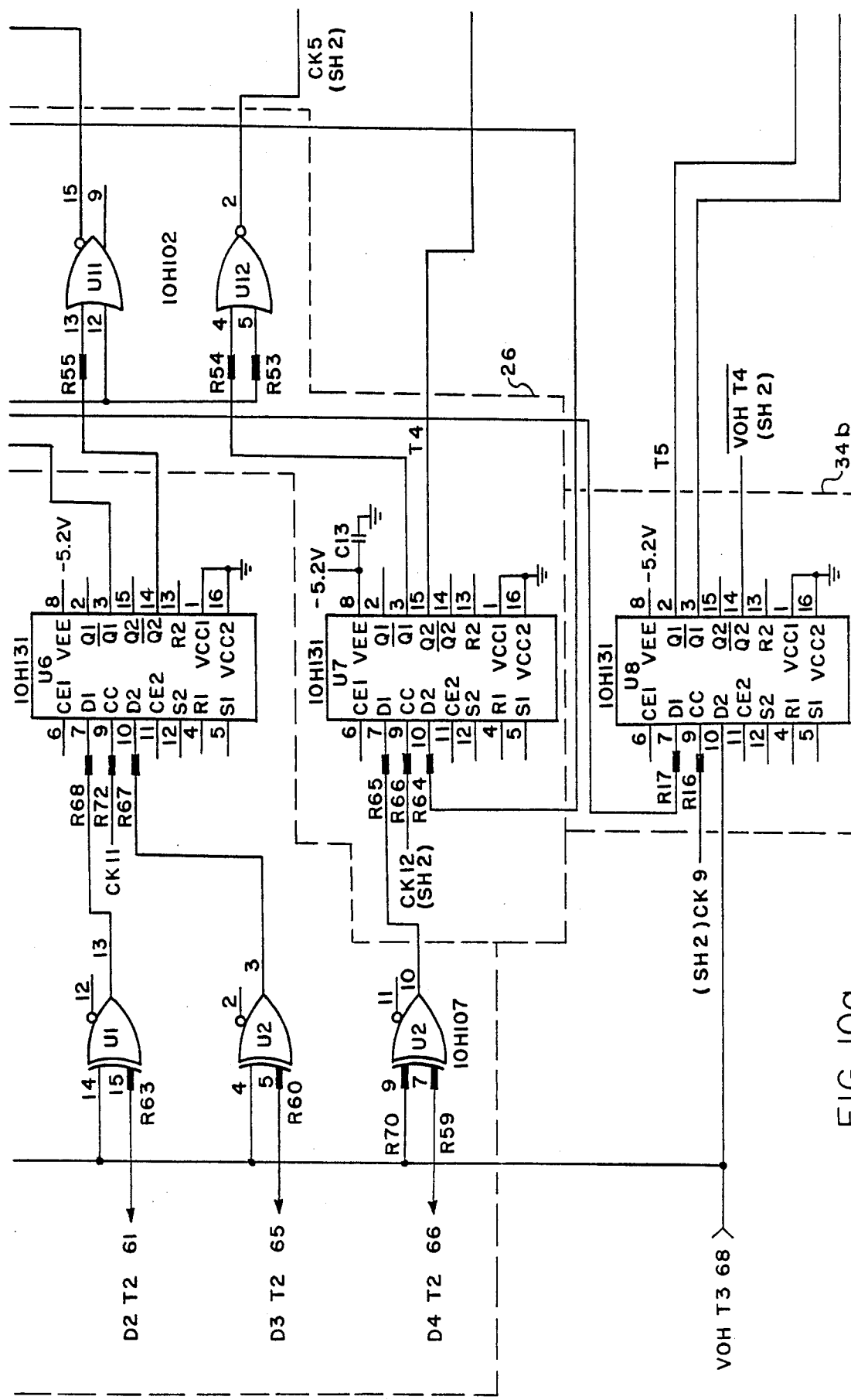
Figure 10B:
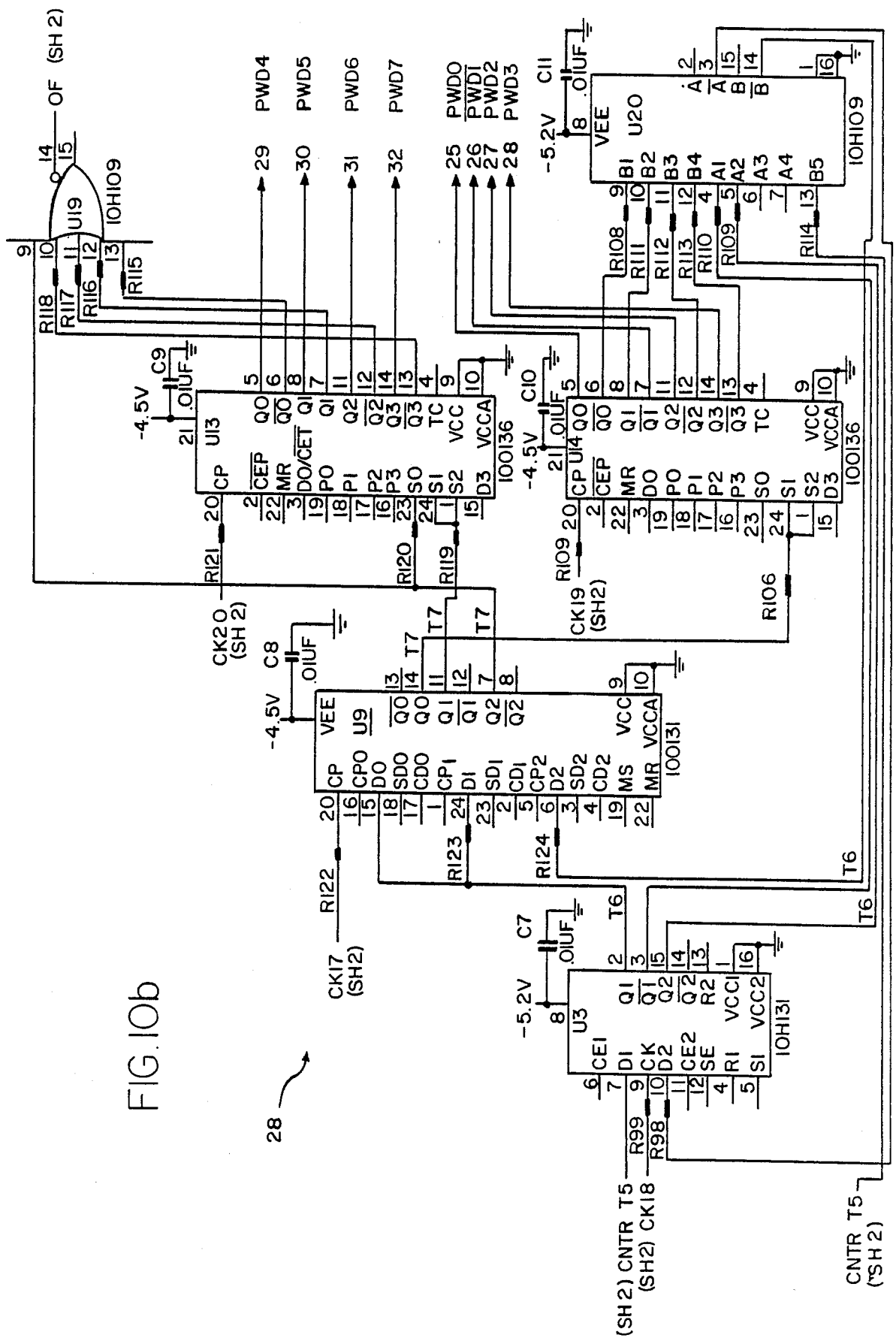
Figure 11A:
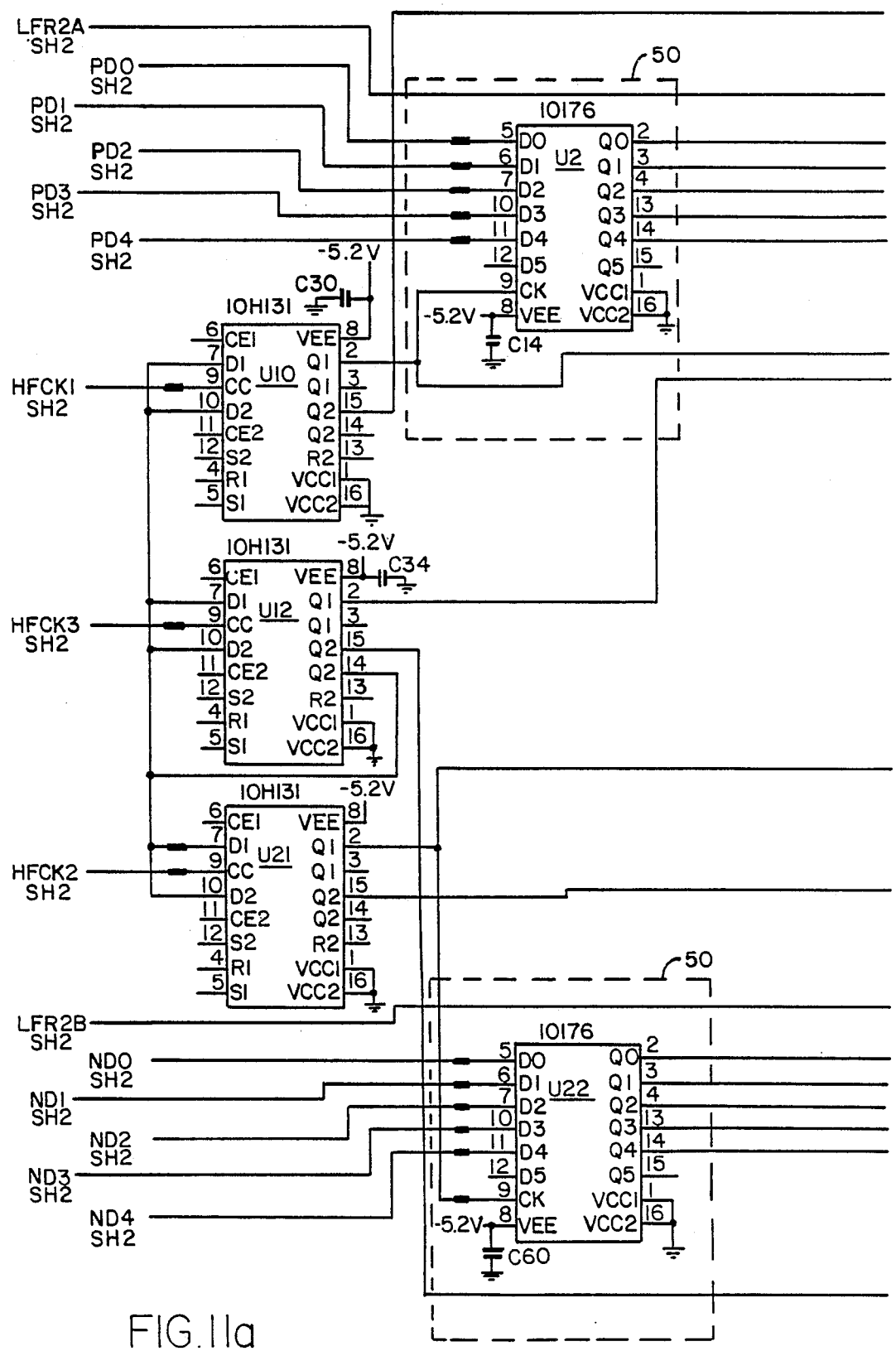
FIGS. 11a–11c are a schematic diagram of the third data register unit, the comparator unit 52, and the output data register unit.
Figure 11B:
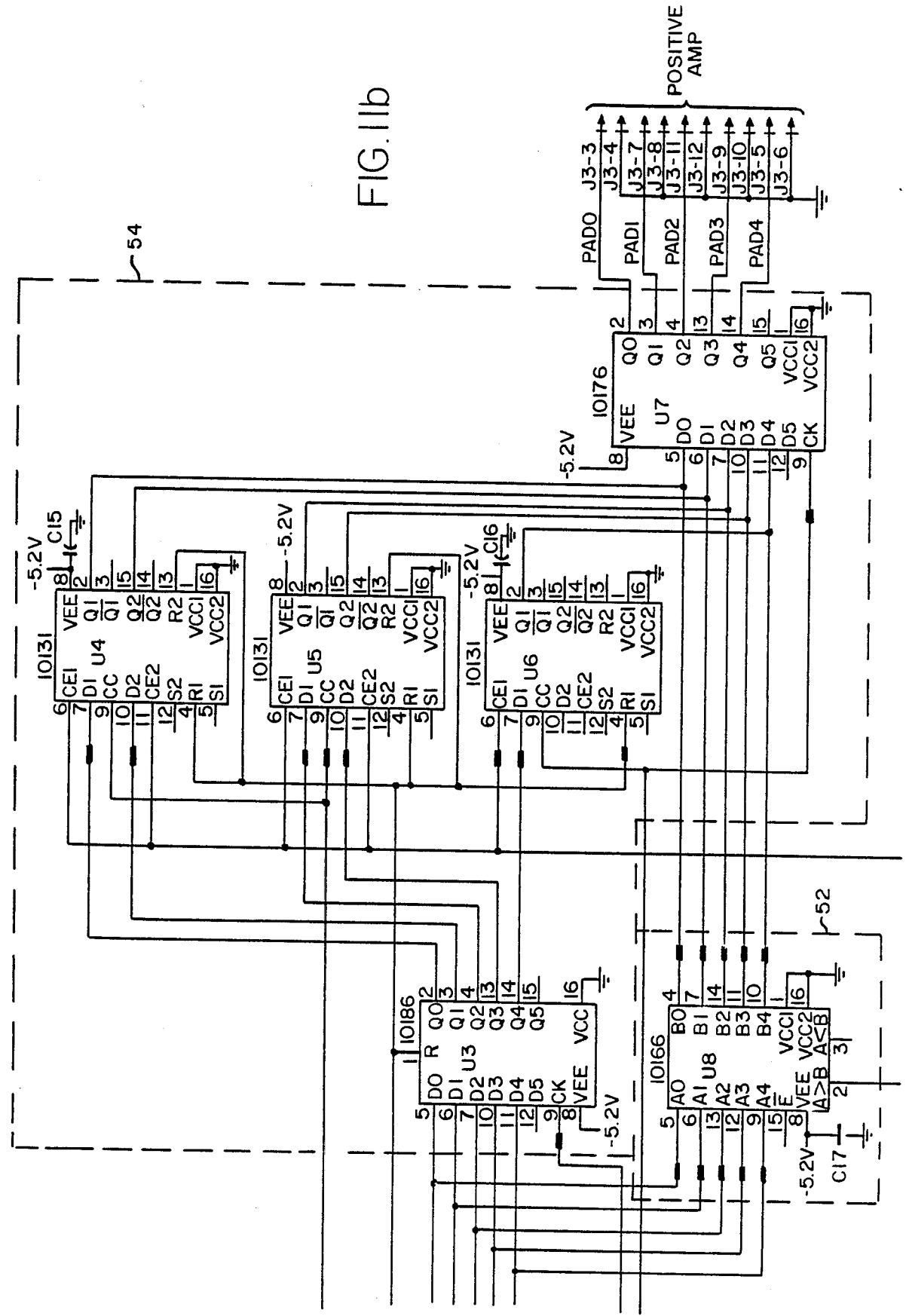
Figure 11C:
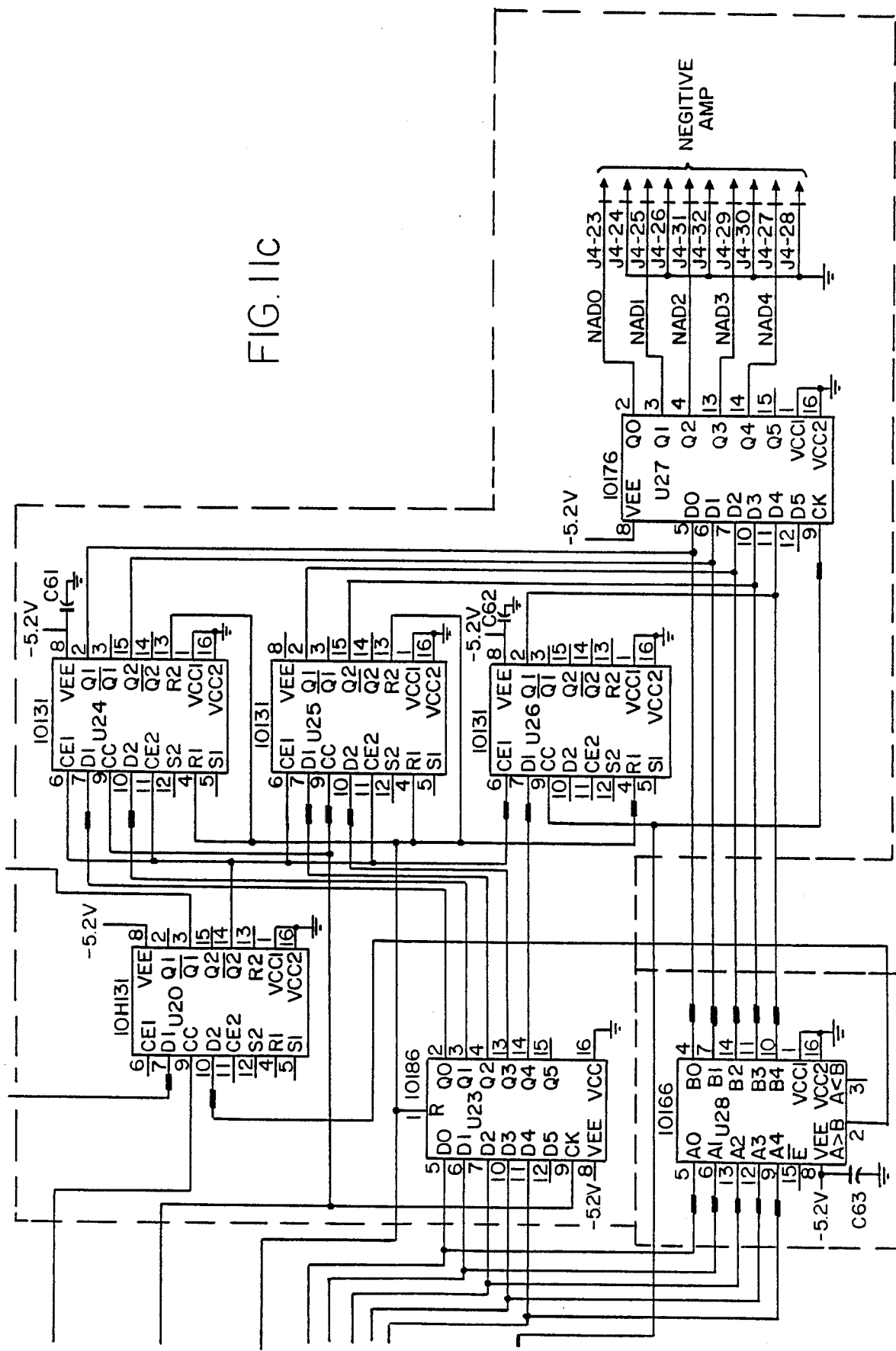
Figure 11:
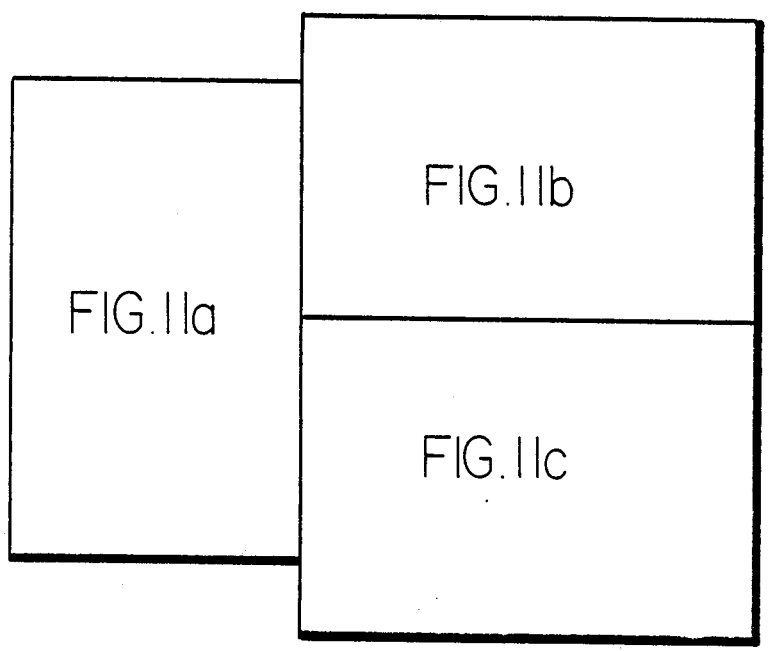
Figure 12A:
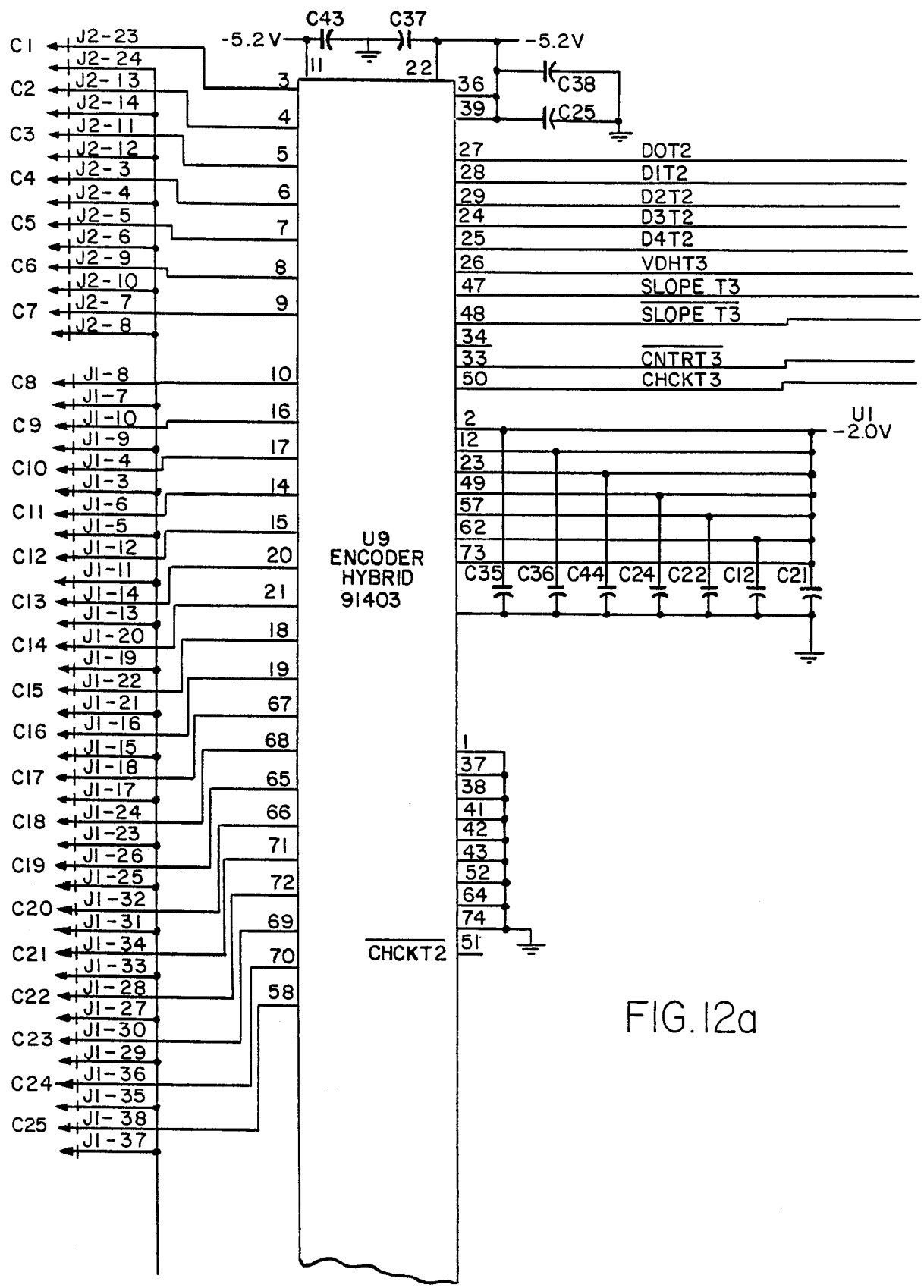
Figure 12A:
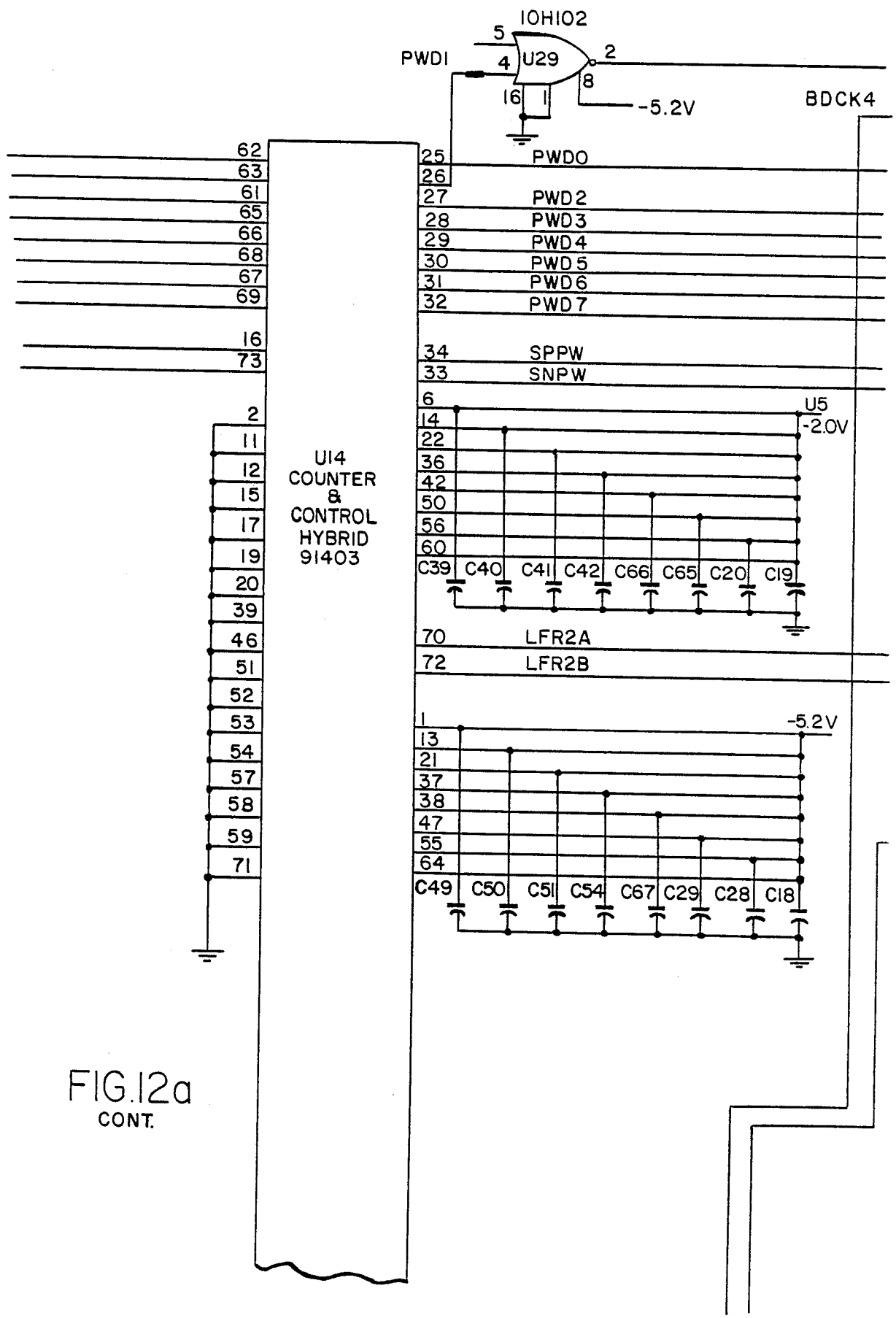
Figure 12B:
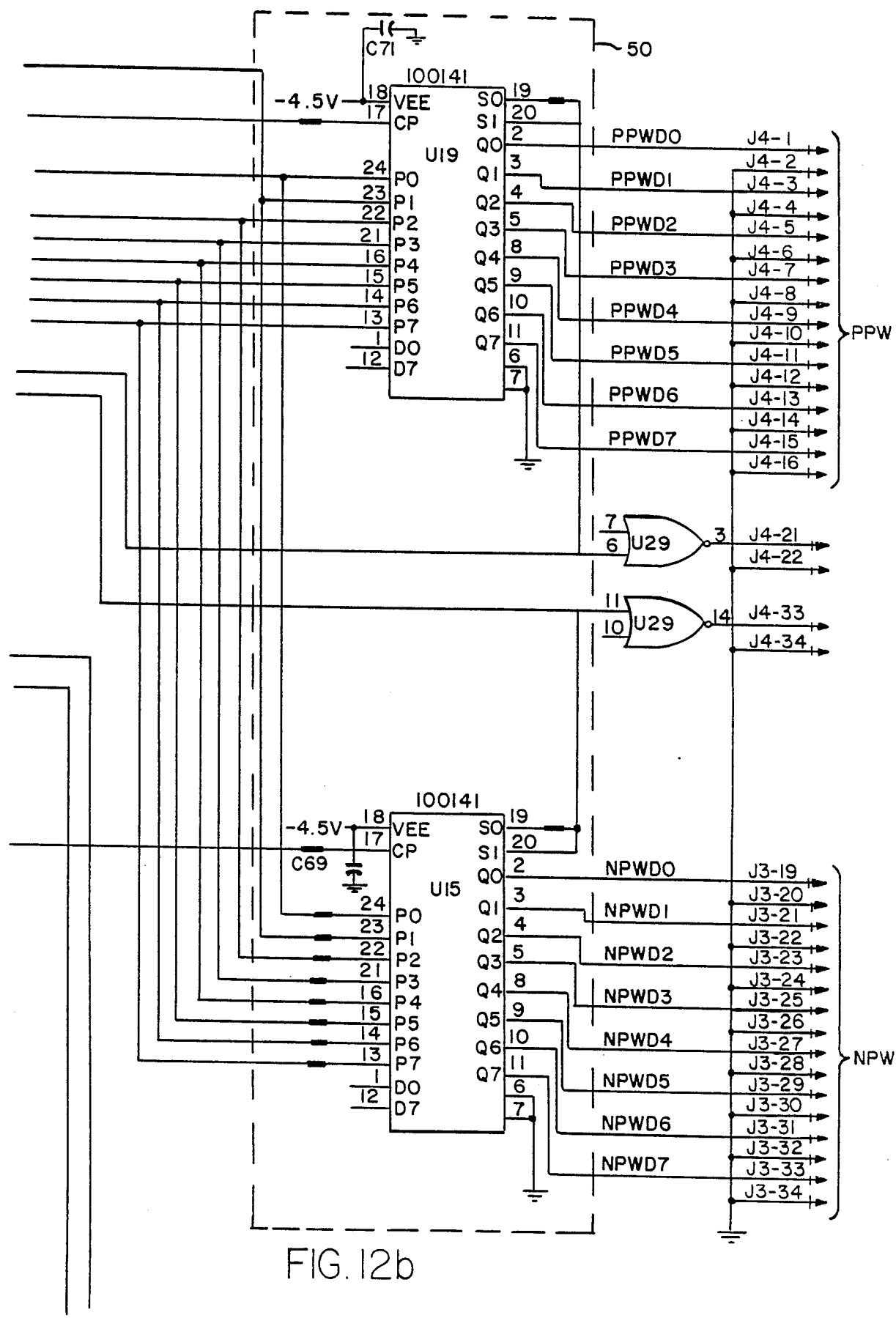
Figure 12C:
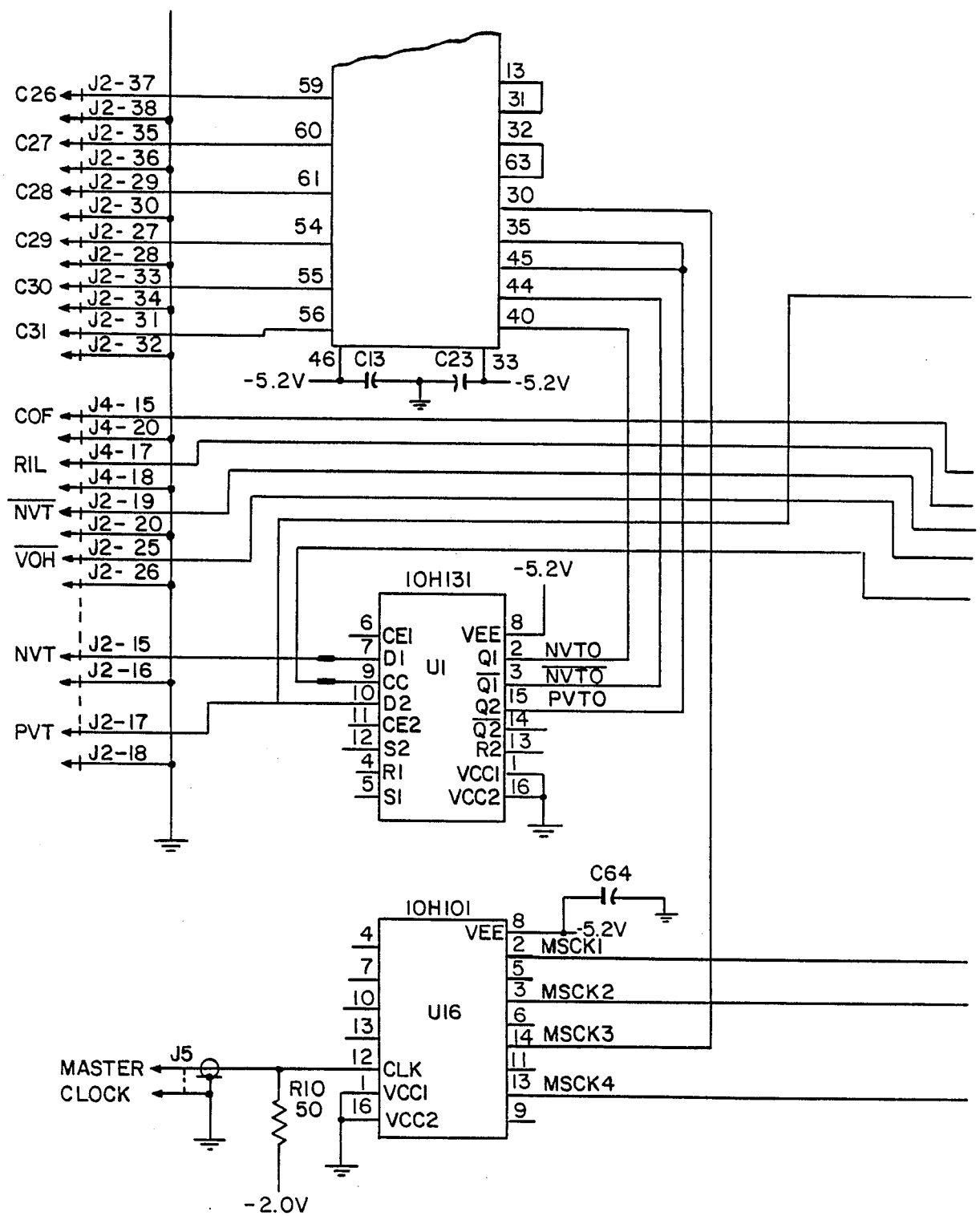
Figure 12C:
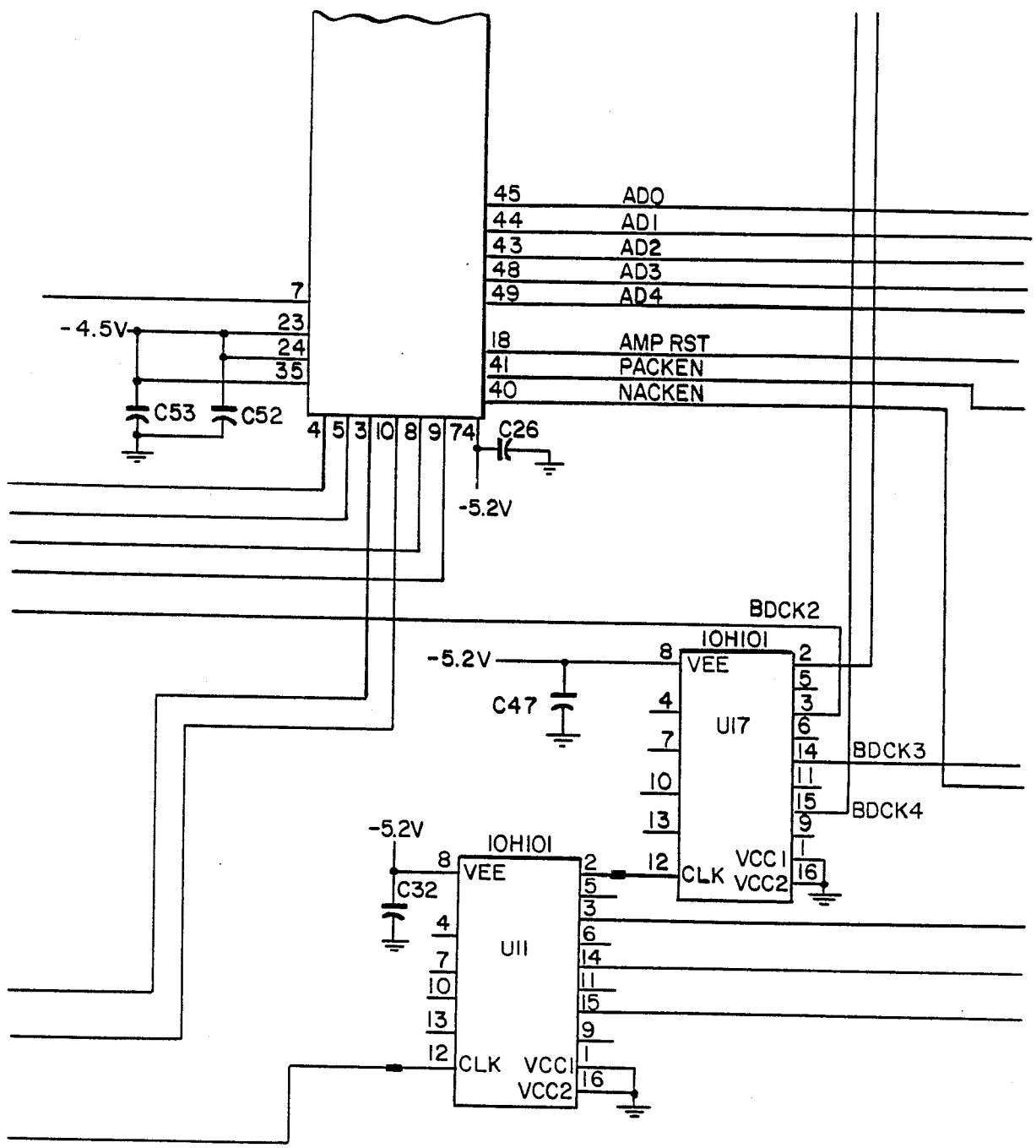
Figure 12D:
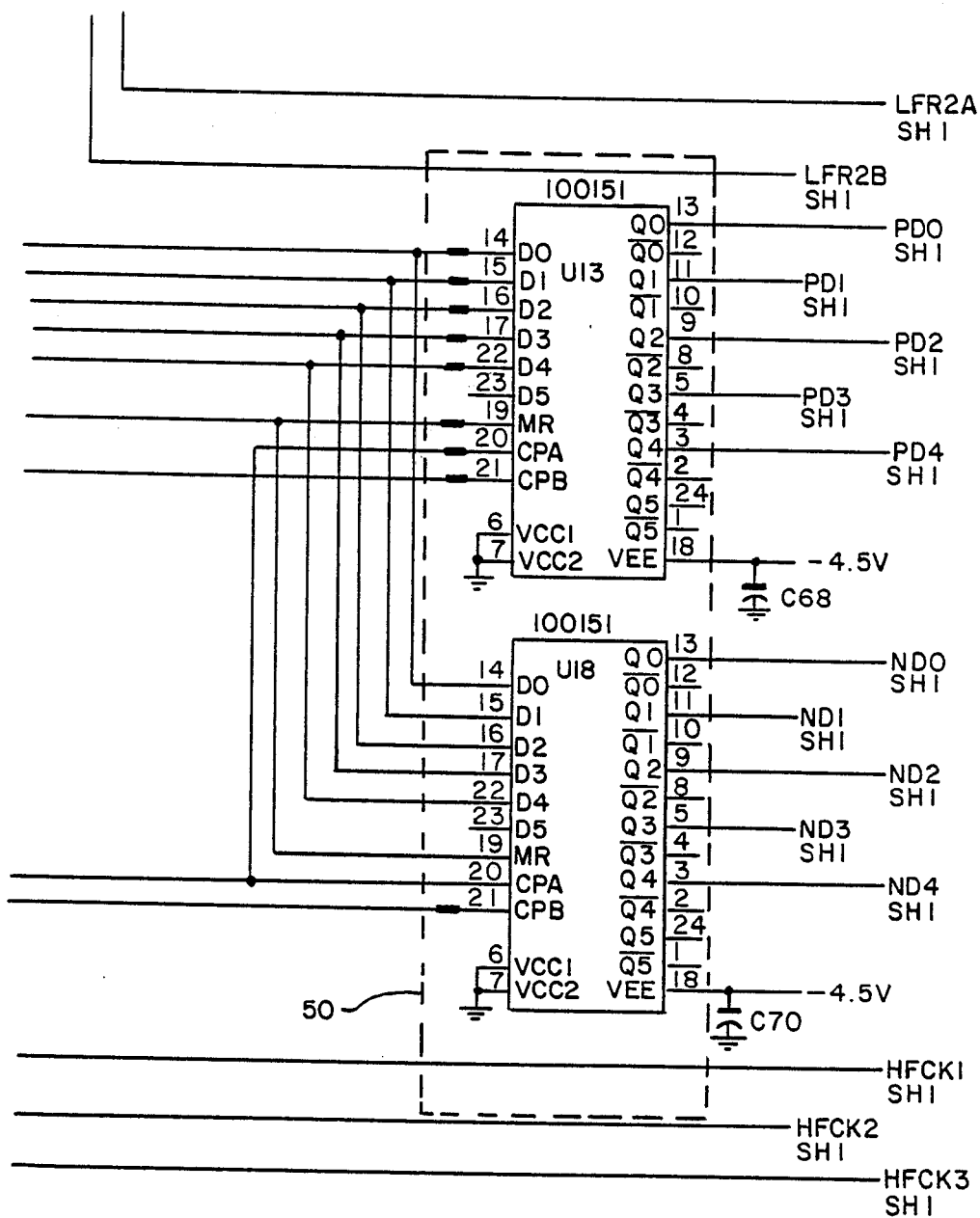
Figure 12:
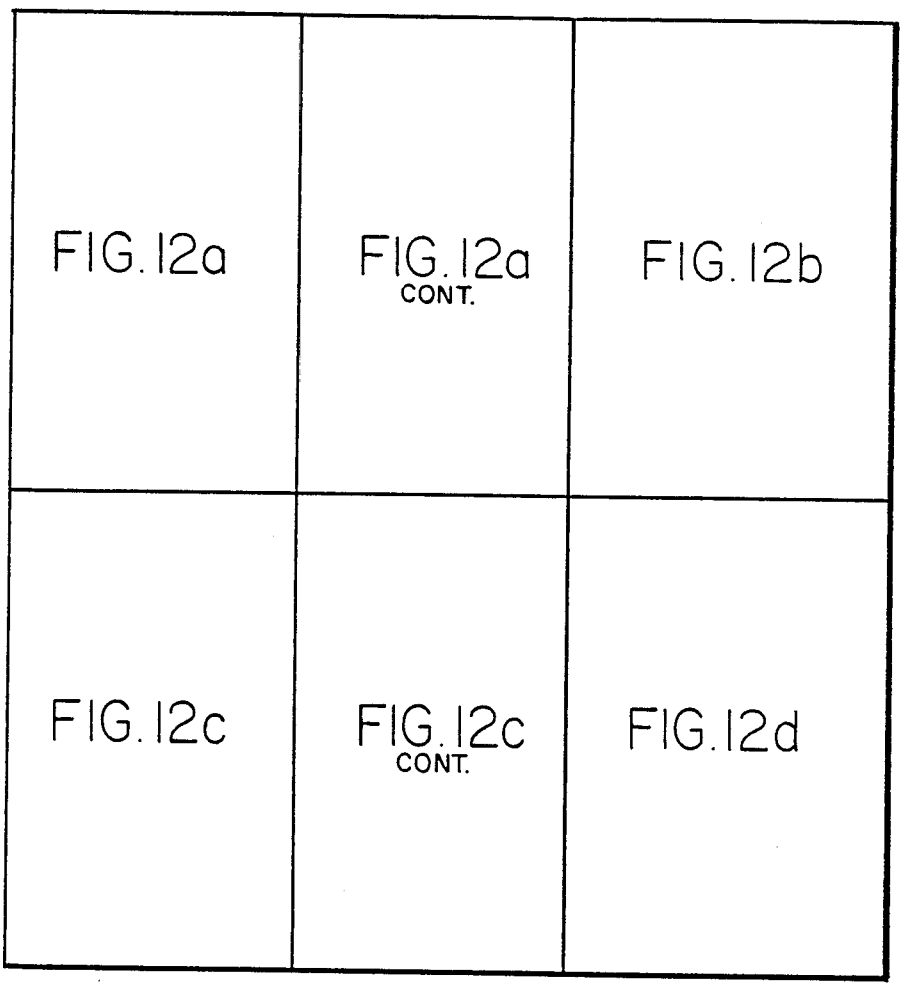

Turning now to FIG. 3, there is shown a detailed block diagram of the transient detector apparatus. The logic input signal which is fed to the composite amplifier unit 10 is utilized to drive both the peak detector unit 12 and the slope detector unit 14. the peak detector unit 12 captures and holds the analog transient amplitude value which may be present in the logic input signal and converts the analog value to a digital equivalent. The output from the peak detector unit 12 is converted to a five (5) bit digital word by the encoder unit 16 and then is sent to the inverter select unit 24. If the transient data was from a negative transient, the logic level signal from the logic control unit 48 will invert the transient data through the inverter select unit 24. The amplitude data is then stored in the first data register unit 30 and then compared to the transient data in the second data register unit 44 to determine if the transient data in the second data register unit 44 should be updated. After every logic transition, the amplitude data in the second data register 44 is transferred to the third data register unit 50 for temporary storage. The output of the third data register unit 50 is then compared with the data in the output data register unit 54 to determine whether the output data register unit 54 should be updated.

The slope detector unit 14 drives the logic control unit 48 in which several logic decisions are made. The logic control unit 48 decides:

a. If the transient originated from the upper logic level or the lower logic level.

b. If the data should be inverted or not.

c. Tells the counter control unit 18 when to start and stop the pulse width measurement which occurs in pulse width measurement unit 28a.

d. Zero sets the first data register unit 30 after a logic transition.

e. Tells the peak detector reset unit 20 to clear the peak detector unit 12 after a logic transition.

f. Transfer transient data to the first data register unit 30 when a slope change is detected.

The pulse width measurement unit 28a is used to capture the pulse width and signal the over flow indicator unit 32 if the pulse width exceeds a given width. The pulse width is then transferred to the pulse width register unit 28b if the pos/neg data select unit 38 decides that it should be transferred. The pulse width register unit 28b is updated everytime the third data register unit 50 is updated. The peak detector unit 12 can be reset either from an external signal through the system reset unit 22 or internally from the peak detector reset unit 20 when a logic change signal occurs.

Schematic diagrams for the units which are shown in FIG. 3 are presented according to the following table:

TABLE I

| Unit | FIG. |
|---|---|
| composite amplifier unit 10 | 4a, 4b, 4c |
| peak detector unit 12 | 5a, 5b, 5c, 5d |
| slope detector unit 14 | 5d, 6c |
| encoder unit 16 | 6a, 6b, 6c |
| counter control unit 18 | 6c, 7 |
| peak detector reset unit 20 | 7 |
| system reset unit 22 | 7 |
| inverter select unit 24 | 10a |
| OR gate unit 26 | 10a |
| pulse width measurement unit 28a | 10b |
| pulse width register unit 28b | 10b |
| first data register unit 30 | 10c |
| overflow indicator unit 32 | 8 |
| timing register unit 34 | 10a |
| AND gate unit 36 | 10c |
| pos/neg data select unit 38 | 9 |
| timing register unit 40 | 7 |
| comparator unit 42 | 10c |
| second data register unit 44 | 10c |
| timing control regulator unit 46 | 10c |
| logic control unit 48 | 6c |
| third data register unit 50 | 11a, 12d, 12b |
| comparator unit 52 | 11c |
| output data register unit 54 | 11c |

Although the invention has been described with reference to a particular embodiment, it will be understood to those skilled in the art that the invention is capable of a variety of alternative embodiments within the spirit and scope of the appended claims.

What is claimed is:

1. A transient detector appartus comprising in combination:

an input monitor probe to receive an input signal, said input signal comprising a logic signal and a transient signal, a signal conditioner means to receive said input signal from said input monitor probe, said signal conditioner means determining the correct logic level of the digital bits in said input signal, said signal conditioner means generating a corrected logic input signal, means for detecting slope receiving said corrected logic input signal from said signal conditioner means, said slope detecting means determining the slope of said corrected logic input signal, said slope detecting means providing a digital pulse signal proprtional to the slope of said corrected logic input signal, a means for switching connected to said signal conditioner means to receive said corrected logic input signal therefrom, first and second peak detector means respectively connected to said switching means for receiving said corrected logic input signal therefrom, said switching means alternating the application of said corrected logic input signal to said first and second peak detector means depending upon the state of said first and second peak detector means, said first and second peak detector means detecting and storing the peak value of the corrected logic input signal applied thereto, a means for generating logic signals connected to said slope detecting means for receiving said digital pulse signal therefrom, said logic means determining whether said digital pulse signal represents a logic or a transient pulse, said logic means generating a validate signal when a transient pulse is determined, said logic means generating a restore signal when a logic pulse is determined, a control means receiving said validate or restore signal from said logic means, said control means monitoring said peak value in said first and second peak detector means, said control means signals either said first or second peak detector means to output said peak value when a validate signal has been received by one peak detector means and a larger value transient signal is received by the other peak detector means, an A/D converter means connected respectively to said first and second peak detector means to receive the peak value therefrom, said A/D converter means generating a digital amplitude signal in proportion to said peak value, a timing means receiving external synch signals, said timing means providing timing signals respectively to said logic means, said switching means, and said A/D converter means, a counter means connected to said slope detecting means to receive said digital pulse signal therefrom, said counter means receiving a control signal from said logic means, a width register means connected to said counter means, said counter means applying said digital pulse signal to said width register means upon receipt of said control signal from said logic means, and, an amplitude register means connected to said A/D converter means to receive said digital amplitude signal therefrom, said amplitude register means providing an amplitude output signal.

2. A transient detector apparatus as described in claim 1 wherein said first and second peak detector means respectively comprise a charge transfer device.

3. A transient detector apparatus as described in claim 2 wherein said logic means generates a restore signal when the voltage level of the input signal crosses the ninety percent level of the full scale input signal value before a slope reversal occurs.

4. A transient detector apparatus as described in claim 2 wherein said logic means generates a validate signal when a slope reversal occurs before the voltage level of the input signal crosses the ninety percent level of the full scale input signal.

* * * * *